United States Patent
Usami et al.

(10) Patent No.: US 7,061,083 B1
(45) Date of Patent: Jun. 13, 2006

(54) SEMICONDUCTOR DEVICES

(75) Inventors: Mitsuo Usami, Tachikawa (JP); Kazutaka Tsuji, Hachioji (JP); Takeshi Saito, Tokyo (JP); Akira Sato, Fuchu (JP); Kenji Sameshima, Hachioji (JP); Kazuo Takaragi, Ebina (JP); Chizuko Yasunobu, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/868,231

(22) PCT Filed: Dec. 10, 1999

(86) PCT No.: PCT/JP99/06944
§ 371 (c)(1),
(2), (4) Date: Jun. 15, 2001

(87) PCT Pub. No.: WO00/36555
PCT Pub. Date: Dec. 10, 1999

(30) Foreign Application Priority Data
Dec. 17, 1998 (JP) .......................... 10-358674

(51) Int. Cl.
*H01L 23/02* (2006.01)
*H01L 29/40* (2006.01)

(52) U.S. Cl. ...................... 257/679; 257/777; 257/778; 257/773; 257/763

(58) Field of Classification Search ................ 257/777, 257/778, 679, 773, 763
See application file for complete search history.

(56) References Cited

U.S. PATENT DOCUMENTS 5,323,704 A   6/1994 Fraczek
5,641,996 A * 6/1997 Omoya et al. ............... 257/787
5,828,130 A * 10/1998 Miller et al. ................. 257/754
5,986,341 A * 11/1999 Usami et al. ................ 257/723
6,172,422 B1 * 1/2001 Chigawa et al. ............ 257/778
6,259,158 B1 * 7/2001 Usami ......................... 257/724
6,320,753 B1 * 11/2001 Launay ........................ 361/760
6,392,143 B1 * 5/2002 Koshio ....................... 174/52.4

FOREIGN PATENT DOCUMENTS

DE          DD 160089 A  *  4/1983

(Continued)

OTHER PUBLICATIONS

Notification of the First Office Action—The Patent Office of the People's Republic of China, Oct. 10, 2003.
European Patent Office Search Report dated Nov. 11, 2004.

*Primary Examiner*—Allan R. Wilson
*Assistant Examiner*—Joseph Nguyen
(74) *Attorney, Agent, or Firm*—Antonelli, Terry, Stout & Kraus, LLP

(57) ABSTRACT

This Application is intended to provide a method for effectively protecting paper or film-form media against forgery. This can be achieved by, for example, embedding in a paper or film-form medium a thin semiconductor chip up to 0.5 mm square, equipped with an antenna, and characterized in that the side walls of the semiconductor chip are formed using oxide films, and in that multiple such semiconductor chips are separated by etching. Limiting the size of these semiconductor chips to 0.5 mm or less enables improvement against bending and concentrated loads, and separating the semiconductor chips by etching results in semiconductor chips free from cracking and breakage. Also, the oxide films constituting the side walls of the semiconductor chips prevents short-circuiting at edges during connection to the respective antennas. Thus, simplified processes can be adopted.

2 Claims, 20 Drawing Sheets

FOREIGN PATENT DOCUMENTS

| | | |
|---|---|---|
| DE | 4337921 A1 | 5/1995 |
| DE | 19639902 A1 | 12/1997 |
| EP | 0737935 A2 | 10/1998 |
| JP | 01035940 | 7/1987 |
| JP | 64-46276 | 3/1989 |
| JP | 01099892 | 4/1989 |
| JP | 8-50672 | 2/1996 |
| JP | 08316366 | 5/1996 |
| JP | 8-202844 | 8/1996 |
| JP | 09-197965 | 7/1997 |
| JP | 10287073 | 4/1998 |
| JP | 10203059 | 8/1998 |
| JP | 10294249 | 11/1998 |
| WO | WO 92/21105 | 11/1992 |
| WO | 0737935 A3 | 10/1996 |

\* cited by examiner 111  112  113  114

201 202 203 204

204 202 203

SEMICONDUCTOR DEVICES

TECHNICAL FIELD

The present invention relates to the technology for implementing a battery-less non-contact identification method intended mainly to protect token-device media, valuable securities (marketable securities), money paper (negotiable commercial coupons or tickets), important documents, IC cards, prepaid cards, and other paper or film-form media against forgery, by using semiconductor chips.

BACKGROUND ART

First, the prior art disclosed in Japanese Laid-Open Patent Application No. Hei8-50672 (1996) is described as an example of art related to the present invention. The corresponding prior art relates to security thread identification equipment intended for various types of token-device media, wherein the equipment is designed so that metallic patterns consisting of character data and other data and embedded in token-device media can be electrically identified by detecting the metal(s). The equipment mentioned above is basically designed so that the forgery only of ordinary paper provided with advanced copying art is made difficult by inserting a metallic pattern into the information contained in the paper.

Next, the prior art disclosed in Japanese Laid-Open Patent Application No. Hei8-202844 (1996) is described. The corresponding prior art is for connecting semiconductor chips to a base substrate made of paper or synthetic paper, by using anisotropic electroconductive paste.

An embodiment of prior art is shown in FIG. 4. This embodiment indicates that there is crack 42 originating from chipping 41. Also, FIG. 4 implies that since pad 43 is located at the top of semiconductor chip 44, short-circuiting could result if electroconductive particles 46 inside adhesive resin 45 come into contact with the edge of the chip 44, and that since antenna 47 is located at the top of substrate 49, electroconductive particles 48 contribute to connection to the electrodes of the antenna 47.

Another embodiment of prior art is shown in FIG. 7, which indicates that since there exists a semiconductor chip equipped with both aluminum pad 73 and surface oxide film 74 on the surface of its device silicon layer 72, electroconductive particles 75 are distributed from adhesive resin 71, and that electroconductive particles 77 captured on the surface of gold pad 76 contribute to electrical continuity with antenna 78. Insulating material 79 is a passivation film. This figure shows the cross-sectional structure of a semiconductor chip connected using a conventional anisotropic electroconductive adhesive.

The present inventors consider that the prior art disclosed in Japanese Laid-Open Patent Application No. Hei8-50672 (1996) poses the following problem. That is to say, when preventive measures are to be taken against the forgery of various token-device media, the present inventors consider that in terms of technology, an added value exists in judging whether the forgery method is easy. In the above-mentioned embodiment of the prior art, therefore, although the sealing of metallic patterns in token-device media is described, this method not only facilitates pattern creation, but also has a risk close to recommending a method of forgery. Although forgery protection technology is for improving safety as its intended purpose, this technology enhances the reliability of forgery at the same time, and for this reason, forgery protection technology has the danger of no safeguards being provided against a high degree of forgery. It is to be deeply considered, therefore, that undeliberate forgery protection technology turns out to act as a forgery augmenter. In this case, referring to the technical level of metallic pattern creation, the present inventors consider it obvious that since the technology relates to the detection of metals, it is possible to analyze patternized information, even without using advanced technology, just by unsealing the medium and closely examining its contents. In other words, since the detection of metallic patterns is the requirement, its implementing method can be easily selected at a normal technical level.

Referring now to problems associated with Japanese Laid-Open Patent Application No. Hei8-202844 (1996), the present inventors consider that the corresponding art assumes paper and other thin media, not mere changes in materials, and that the mechanical strength of paper and the strength of semiconductor chips require even deeper studies. In this embodiment of the prior art, when a configuration with a thickness up to 100 microns is considered, whether problems arise depends greatly on whether no mechanical stresses are applied. That is to say, different restrictions must be defined to mount semiconductor chips on thin paper-form media. More specifically, the thickness and size of the semiconductor chips must be studied. For example, when examining whether a semiconductor chip 1 mm in size can withstand use at a normal operating level with paper 100 microns thick, one needs to study about whether the semiconductor chip can withstand use, not whether it can be structurally formed. The present inventors have considered that this conventional embodiment alone does not suffice to establish the realization style of practically usable thin media up to 100 microns thick.

Next, problems relating to the embodiment of prior art that is shown in FIG. 4 are described. During the processing of semiconductor chip periphery, since semiconductor chips that have been diced using a diamond blade are used, if external stresses are applied to the semiconductor chips and concentrated on the periphery thereof, the periphery will break or crack and some or all of the semiconductor chip functions will be lost. If these semiconductor chips are sealed in thin media such as paper, since bending or concentrated load stresses are prone to be applied, even a slight chipping (namely, a nick) around the semiconductor chips will result in their damage.

Next, problems relating to the embodiment of prior art that is shown in FIG. 7 are described. In this structural view, despite gold bumps existing, no consideration is given to the fact that side effects may be caused by the presence of the anisotropic electroconductive adhesive or electroconductive adhesive around the semiconductor chips. More specifically, no consideration is given to possible increases in the vertical dimensions of the structure due to the presence of the gold bumps, or to the likely occurrence of short circuits around the semiconductors. As a result, there exists the problem that the configuration of the semiconductor chips that includes the gold bumps makes the total structure of the equipment exceptionally thick and prevents bending-resistant structure from being achieved.

DISCLOSURE OF THE INVENTION

One means of solving the problems described above is by forming a semiconductor device characterized in that it uses a semiconductor chip whose long side is up to 0.5 mm in plane dimension, and in that the semiconductor chip is inserted in antenna-equipped form into a paper or film-form medium so as to send information of multiple bits.

A second means of solving the problems described above is by forming a semiconductor device characterized in that it uses a semiconductor chip whose periphery is made of an insulating material, and in that the terminals on the semiconductor chip are connected to the terminals on its mounting substrate via an electroconductive adhesive.

A third means of solving the problems described above is by forming a semiconductor device characterized in that it uses semiconductor chips having a plane dimension up to 0.5 mm on the long side of each, and in that the semiconductor chips are separated by etching and inserted in antenna-equipped form into a paper or film-form medium so as to send information of multiple bits.

A fourth means of solving the problems described above is by forming a semiconductor device characterized in that it uses a semiconductor chip whose long side is up to 0.5 mm in plane dimension, and in that the semiconductor chip is inserted in antenna-equipped form into a paper or film-form medium so as to send information of the multiple bits formed by electron-beam direct plotting.

A fifth means of solving the problems described above is by forming a semiconductor device characterized in that it uses a semiconductor chip whose periphery is made of an insulating material, and in that the semiconductor chip has pads made of tungsten and is inserted in antenna-equipped form into a paper or film-form medium so as to send information of multiple bits.

A sixth means of solving the problems described above is by forming a semiconductor device characterized in that it uses a semiconductor chip whose periphery is made of an insulating material, and in that the device on the principal plane of each semiconductor chip has one or more semiconductor chip pads and the semiconductor chip is inserted in antenna-equipped form into a paper or film-form medium so as to send information of multiple bits.

A seventh means of solving the problems described above is by forming a semiconductor device characterized in that it uses a semiconductor chip whose long side is up to 0.5 mm in plane dimension, and in that the semiconductor chip is inserted in capacitor-containing-antenna-equipped form into a paper or film-form medium so as to send information of multiple bits.

An eighth means of solving the problems described above is by forming a semiconductor device characterized in that it uses a semiconductor chip whose long side is up to 0.5 mm in plane dimension, in that the semiconductor chip is inserted in antenna-equipped form into a paper or film-form medium so as to send information of multiple bits, and in that the information is cryptographed and printed on the medium.

A ninth means of solving the problems described above is by forming a semiconductor device characterized in that it uses a semiconductor chip whose periphery is made of an insulating material, and in that a plurality of pads smaller than a pad formed for connection to an antenna are present on the semiconductor chip in order to generate random numbers.

A tenth means of solving the problems described above is by forming a semiconductor device characterized in that it uses a semiconductor chip containing a writable memory area, in that an area for generating a first random number is present in the semiconductor chip, and in that after the first random number has been read out, then cryptographed, and written into the memory area, a second random number different from the first random number is read out and cryptographed and the content in the memory area is read out and replaced with the second random number in order to verify that the semiconductor chip is not a forgery.

An eleventh means of solving the problems described above is by forming a semiconductor device characterized in that it gives periodically amplitude-modulated carrier waves to an antenna-equipped semiconductor chip on a multi-frequency basis, in that the leading edge of each periodic signal is used as a clock, and in that the internal antenna load of the semiconductor chip is changed during the particular period so as to send one bit of information stored within the chip.

A twelfth means of solving the problems described above is by forming a semiconductor device characterized in that it gives periodically amplitude-modulated carrier waves to an antenna-equipped semiconductor chip on a multi-frequency basis, in that the semiconductor chip has a counter, in that the leading edge of each periodic signal is used as a clock and sent to the counter, and in that the output signal of the counter selects memory output and the internal antenna load of the semiconductor chip is changed during the particular period so as to send one bit of information stored within the chip.

A thirteenth means of solving the problems described above is by forming a semiconductor device characterized in that a plurality of semiconductor chips share a single antenna and in that each semiconductor chip operates according to the particular load status of the antenna.

A fourteenth means of solving the problems described above is by forming a semiconductor device characterized in that all or part of physical information on the size, thickness, position, angle-of-inclination, and other factors of the semiconductor chip to be inserted in antenna-equipped form into a paper or film-form medium so as to send information of multiple bits is cryptographed and printed on the medium.

A fifteenth means of solving the problems described above is by forming a semiconductor device characterized in that it uses a semiconductor chip whose long side is up to 0.5 mm in plane dimension, and in that the semiconductor chip is inserted in antenna-equipped form between two or more roll sheets within a paper or film-form medium so as to send information of multiple bits.

A sixteenth means of solving the problems described above is by forming a semiconductor device characterized in that a semiconductor chip having a maximum plane dimension of 0.5 mm has a mounted antenna smaller than the semiconductor chip, and in that multiple such semiconductor chips are inserted into a paper or film-form medium so as to send information of multiple bits without radio interference.

A seventeenth means of solving the problems described above is by forming a semiconductor device characterized in that it uses a semiconductor chip whose long side is up to 0.5 mm in plane dimension, in that multiple such semiconductor chips are inserted in antenna-equipped form into a paper or film-form medium so as to send information of multiple bits, and in that no such semiconductor chips are arranged at integer-multiple folding positions on the medium.

An eighteenth means of solving the problems described above is by forming a semiconductor device characterized in that it uses a semiconductor chip whose long side is up to 0.5 mm in plane dimension, in that the semiconductor chip is inserted in antenna-equipped form into a paper or film-form medium so as to send information of multiple bits, and in that the corners of the semiconductor chip are taper-cut to at least $\frac{1}{100}$ of the length of its long side.

A nineteenth means of solving the problems described above is by forming a semiconductor device characterized in that it uses a semiconductor chip whose long side is up to 0.5 mm in plane dimension, in that the semiconductor chip is inserted in antenna-equipped form into a paper or film-form medium so as to send information of multiple bits, and in that the semiconductor chip exists in a braille-use bump.

A twentieth means of solving the problems described above is by forming a semiconductor device characterized in that it uses a plurality of semiconductor chips each having a long side up to 0.5 mm in plane dimension, in that the semiconductor chips are inserted in antenna-equipped form into a paper or film-form medium so as to send information of multiple bits, and in that the information contained in each semiconductor chip is printed in a cryptographed pattern on the medium.

A twenty-first means of solving the problems described above is by forming a semiconductor device characterized in that it uses a semiconductor chip whose long side is up to 0.5 mm in plane dimension, in that the semiconductor chip is inserted in antenna-equipped form into a paper or film-form medium so as to send information of multiple bits, and in that a metal thicker than the semiconductor chip is bonded thereonto.

A twenty-second means of solving the problems described above is by forming a semiconductor device characterized in that it uses a semiconductor chip whose long side is up to 0.5 mm in plane dimension, in that the semiconductor chip is inserted in antenna-equipped form into a Japanese-paper medium so as to send information of multiple bits, and in that when Japanese paper is processed in water, the semiconductor chip is handled as part of the paper fiber section and mounted in or on the paper.

A twenty-third means of solving the problems described above is by forming semiconductor devices such as described above and further characterized in that this semiconductor chips are formed using silicon-on-insulator wafers.

A twenty-fourth means of solving the problems described above is by forming semiconductor device such as described above and further characterized in that said semiconductor chips are formed to a thickness up to 50 microns.

A twenty-fifth means of solving the problems described above is by forming a semiconductor device equipped with at least antennas and IC semiconductor chips for exchanging information with a reader/writer without electrical contact, wherein the semiconductor device is characterized in that each antenna comprises one pair of rectangular electroconductive materials and in that the width of the portion to be connected to each IC semiconductor chip is smaller than the length of at least one side of the semiconductor chip.

A twenty-sixth means of solving the problems described above is by forming a semiconductor device equipped with at least antennas (and IC semiconductor chips up to 0.5 mm in maximum plane dimension) for exchanging information with a reader/writer without electrical contact, wherein the semiconductor device is characterized in that each such antenna comprising one pair of thin linear electroconductive materials is provided on the side at which the device of each IC semiconductor chip is formed, and on the side opposite to that, and in that the cross-sectional area at the portion of the antenna that is to be connected to the IC semiconductor chip is smaller than the area of the semiconductor chip.

A twenty-seventh means of solving the problems described above is by developing a manufacturing method for such semiconductor devices described above, wherein the manufacturing method is characterized in that it comprises a process for forming said IC semiconductor chips on semiconductor wafers, a process for bonding said semiconductor wafers to the required support bodies, a process for separating said semiconductor wafers from each other, and a process for simultaneously connecting each said multiple antenna and each IC semiconductor chip that has been separated on its support body.

A twenty-eighth means of solving the problems described above is by developing a manufacturing method for such semiconductor devices as described above, wherein the manufacturing method is characterized, in that it comprises a process for simultaneouly connecting said multiple antennas and of all the IC semiconductor chips that have been separated on said support bodies, only IC semiconductor chips arranged in line.

A twenty-ninth means of solving the problems described above is by developing a manufacturing method for such semiconductor devices as described above, wherein the manufacturing method is characterized in that it comprises a process for simultaneoulsy connecting said multiple antennas and of all the IC semiconductor chips that have been separated on said support bodies, only IC semiconductor chips that have been separated on said support bodies, IC semiconductor chips that are arranged two-dimensionally.

A thirtieth means of solving the problems described above is by forming a semiconductor device equipped with at least antennas and IC semiconductor chips for exchanging information with a reader/writer without electrical contact, wherein the semiconductor device is characterized in that each said antenna is provided on the side at which the device of each said IC semiconductor chip is formed, and on the side opposite to that, and in that the principal plane of the IC semiconductor chip is inclined with respect to the major axial direction of the antenna.

THE PREFERRED EMBODIMENTS OF THE INVENTION

Figure 1:
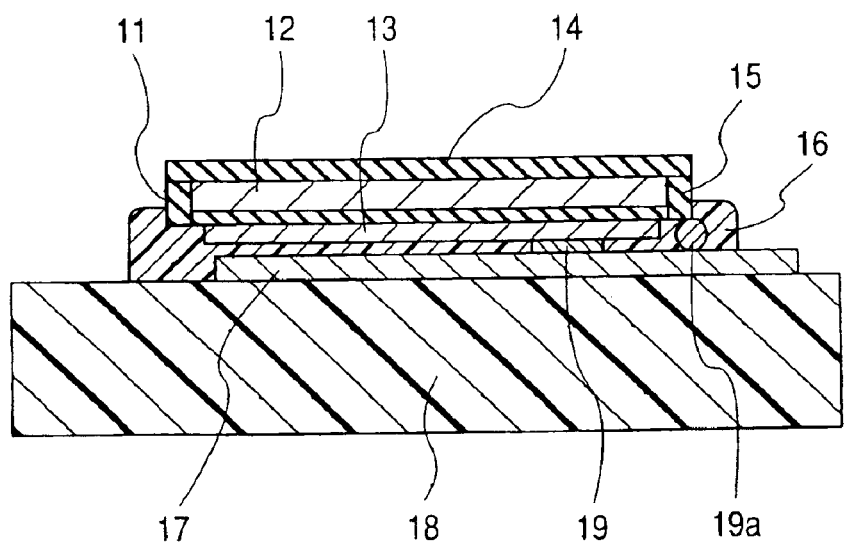
FIG. 1 is a view showing an embodiment of the present invention.

FIG. 1 shows an embodiment of the present invention. Semiconductor chip side wall oxide film 11 is located on the side of device layer silicon 12, and pad 13 is located on the surface of a semiconductor chip equipped with back oxide film 14 and semiconductor chip side wall oxide film 15, and is connected to antenna 17, which is formed on the surface of a substrate 18 by use of an electroconductive material such as silver paste. Although electroconductive particles 19 are located directly between the pad and the antenna and thus contribute to vertical electrical continuity, electroconductive particles 19a are located near the side of the semiconductor chip and do not make a direct contribution to electrical continuity between the pad and the antenna. However, for a semiconductor device characterized in that the periphery of a semiconductor chip is formed using an insulating material and in that the terminals on the semiconductor chip are connected to the terminals of its mounting substrate by use of an electroconductive adhesive, short circuits between the antenna and the semiconductor chip will not occur, even if the above-mentioned electroconductive particles come into contact with the edge of the semiconductor chip. Also, the use of a normal electroconductive adhesive, not an anisotropic one, gives particularly significant favorable effects. That is to say, electrical short-circuiting will not result, even if the electroconductive adhesive comes into contact with the edge of the semiconductor chip.

Figure 2:
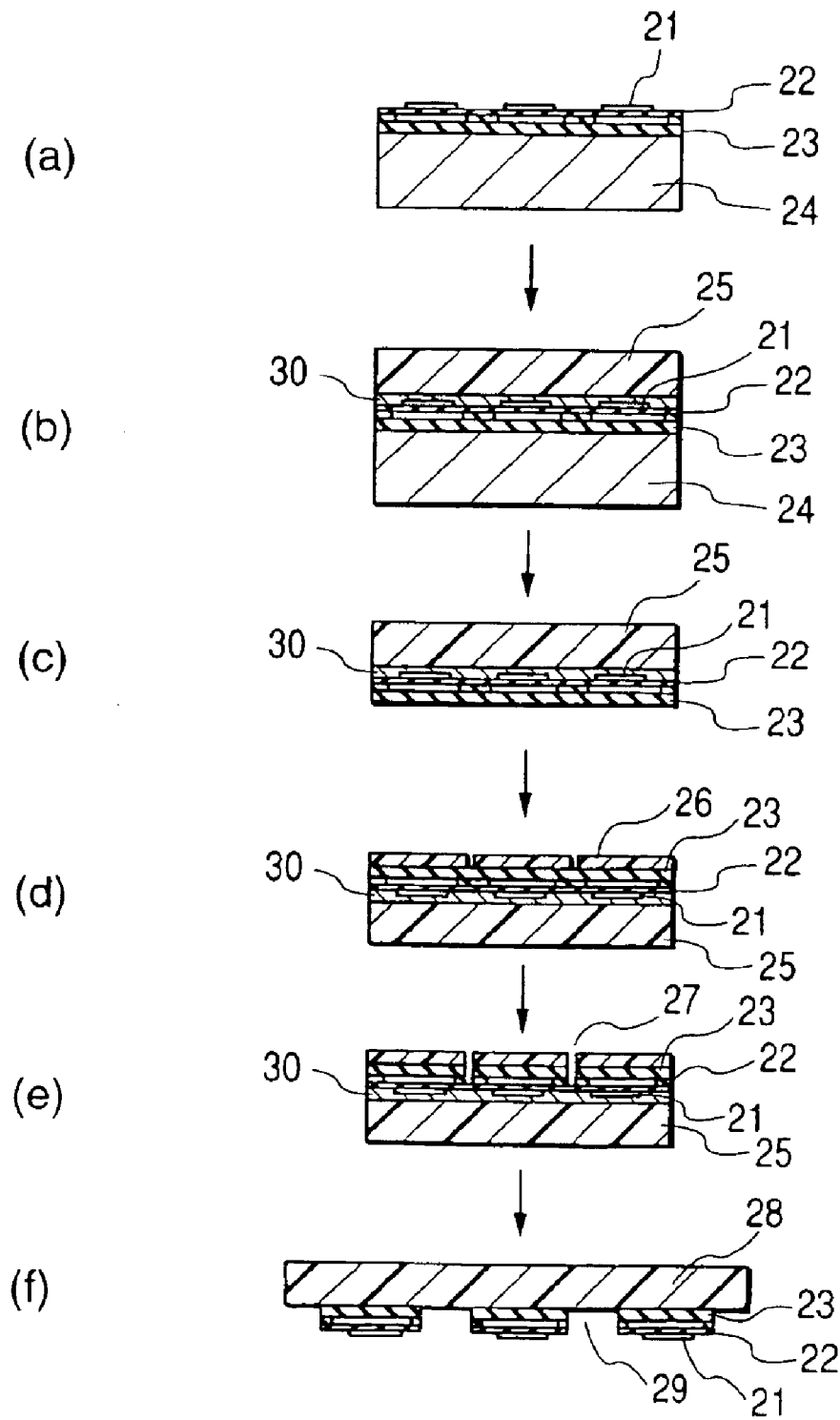
FIG. 2 is a view showing another embodiment of the present invention.

Views (a) to (f) in FIG. 2 show another embodiment of the present invention. View (a) shows the cross section of the semiconductor chips existing immediately after they have been finished into wafer form. The side wall oxide films shown in FIG. 1 are oxidized beforehand at where the semiconductor chips are to be separated in wafer form, and these oxide films are connected to the principal plane of each semiconductor chip and to the oxide films of oxide film layer 23. Pad 21 is formed on device layer silicon 22, and the oxide film layer 23 is inserted in sandwiched form between silicon substrate 24 and the device layer silicon. This structure is called "silicon-on-insulator wafer structure." View (b) shows the cross section of the wafer existing immediately after a support tape has been continuously attached thereto. Numeral 30 in FIG. 2(b) denotes an adhesive material layer. In the remainder hereof, numeral 30 denotes a similar adhesive material layer. FIG. 2(c) is a cross-sectional view of the silicon substrate 24 existing immediately after it has been removed by etching with chemicals such as potassium hydroxide, hydrazine, and/or ammonia. FIG. 2(d) is a cross-sectional view of the wafer existing immediately after its back face has been coated with photoresist 26, then exposed to light, and has undergone photographic processing. The sections where the semiconductor chips are to be separated are already pattern-printed. FIG. 2(e) is a cross-sectional view of the wafer existing immediately after etching grooves 27 have been formed. Etching uses either hydrofluaric acid, which is usually used for etching oxide films, or a chemical mixed with it, or a dry etchant. FIG. 2(f) is a cross-sectional view of the semiconductor chip that has been expanded using expanded support tape 28. In this way, semiconductor chips that are thin, compact, and free of chipping, can be formed easily and economically. The semiconductor chips thus formed are characterized in that each of them has a plane dimension up to 0.5 mm on the long side, in that the semiconductor chips are separated by etching as shown in this embodiment, and in that they are inserted in antenna-equipped form into a paper or film-form medium so as to send information of multiple bits.

Figure 3:
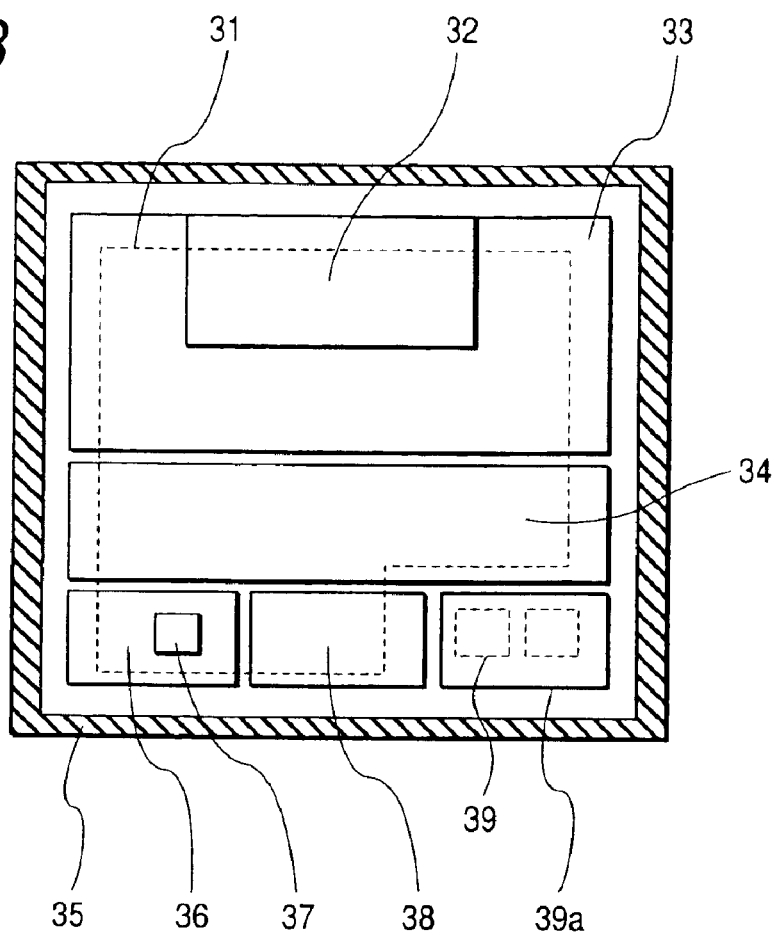
FIG. 3 is a view showing still another embodiment of the present invention.
Figure 4:
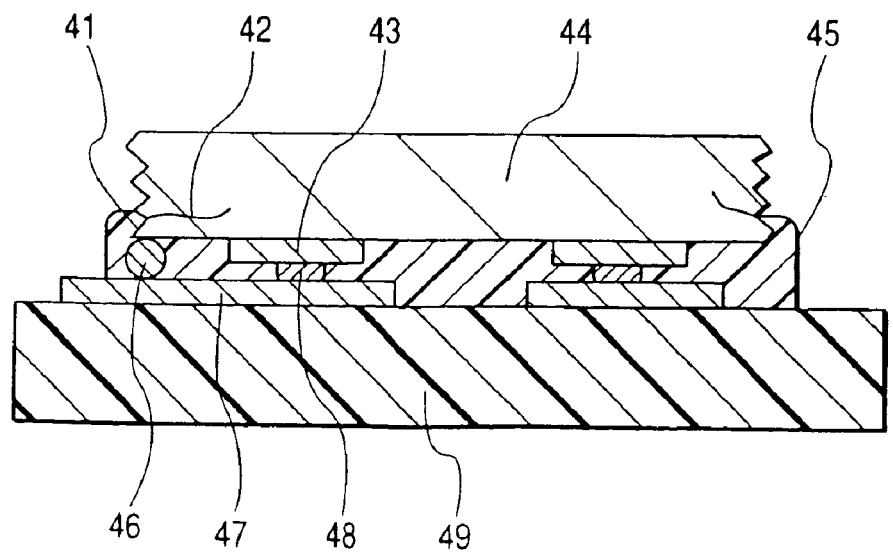
FIG. 4 is a view showing an embodiment of prior art.

FIG. 3 shows yet another embodiment of the present invention. Pad 31 is formed on active devices such as memory mat 32, reading circuit 33, selector circuit 34, sending/receiving circuit 36, and power circuit 38. This arrangement enables pads of a large area to be formed for reliable and stable connection to an antenna. The semiconductor chip is surrounded by a semiconductor chip side wall oxide film 35 to prevent short-circuiting due to contact with an electroconductive adhesive. The pad 31 is connected to each circuit via through-hole 37. The semiconductor chip has small pads 39 for generating random numbers, and since, at these pads, the semiconductor chip and the antenna can obtain analog data which varies with their lateral contact resistance against electroconductive particles and with the particular fluctuations in capacity against ferroelectrics, random number-generating circuit 39a performs analog-to-digital conversions into information. The information that has thus been obtained can be used as non-iterative unique information, just like a person's fingerprints, and can therefore contribute to forgery protection of the medium for which the semiconductor chip is to be used. Since the above-mentioned unique information will be lost if the semiconductor chip and the antenna are separated, the information features high tampering resistance, namely, resistance to forgery. To protect media from forgery, therefore, it is valid to use a semiconductor device characterized in that as described above, the device on the principal plane of each semiconductor chip has one or more pads and these semiconductor chips are inserted in antenna-equipped form into a paper or film-form medium so as to send information of multiple bits, and in that each semiconductor chip has a plane dimension up to 0.5 mm on its long side and a plurality of pads smaller than a pad formed for connection to an antenna are present on the semiconductor chip in order to generate random numbers. At memory mat 32, each semiconductor chip on the wafer is arbitrarily pattern-printed with random numbers by electron-beam direct plotting in a very small area size.

Figure 5:
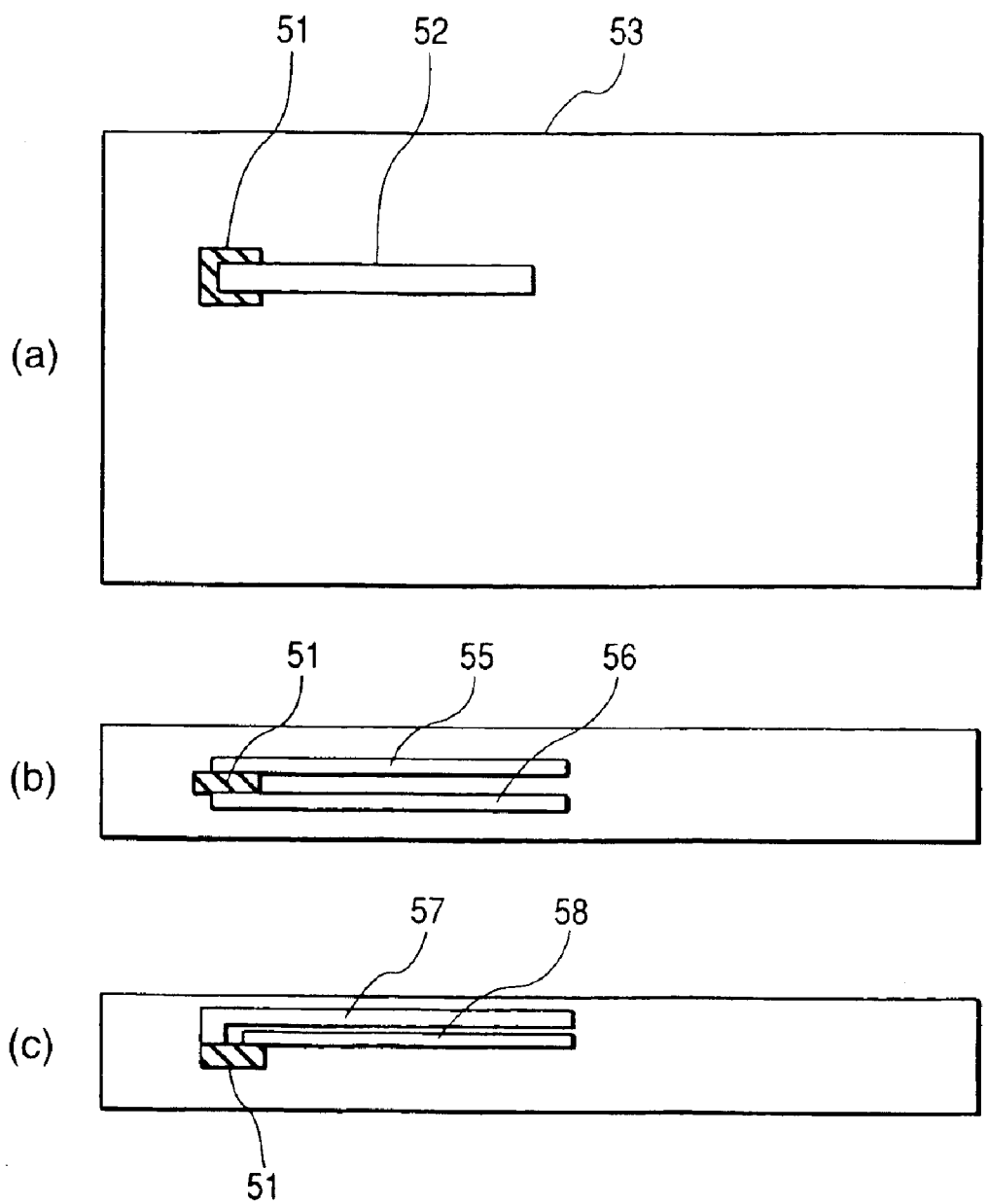
FIG. 5 is a view showing a further embodiment of the present invention.

Views (a) to (c) in FIG. 5 show still another embodiment of the present invention. View (a) in FIG. 5 is a cross-sectional view of semiconductor chip 51 connected to antenna 52 and existing in a film-form medium. View (b) in FIG. 5 is a partial cross-sectional view of the semiconductor chip in FIG. 5(a) and shows two electrodes taken from the surface and back of the semiconductor chip, and these electrodes (electrodes 1 and 2) serve as antenna electrodes 55 and 56 to form capacities. It has thus become possible to form a small semiconductor chip not having a capacity in itself and hence advantageous in terms of economy and yield. View (c) in FIG. 5 shows multiple electrodes taken from the surface of the semiconductor chip, and these electrodes (electrodes 3 and 4) serve as antenna electrodes 57 and 58 to form capacities. Such device set forth above can be made into a more economical and more effective forgery protection and identification device by forming a semiconductor device characterized in that semiconductor chips with a plane dimension up to 0.5 mm on the long side are inserted in capacitor-containing-antenna-equipped form into a paper or film-form medium so as to send information of multiple bits.

Figure 6:
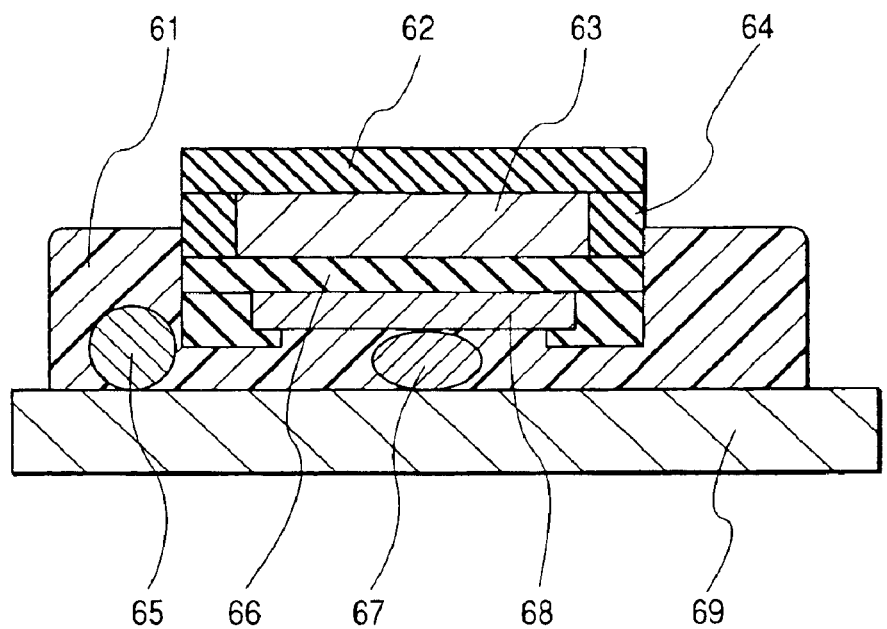
FIG. 6 is a view showing still further embodiment of the present invention.
Figure 7:
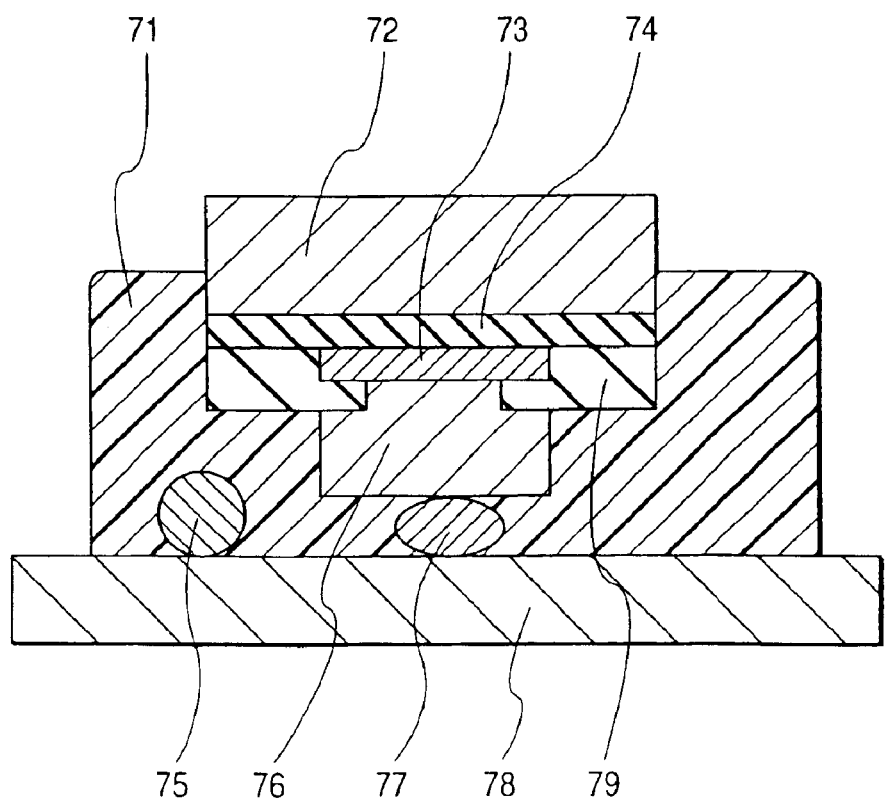
FIG. 7 is a view showing another embodiment of prior art.

FIG. 6 shows still another embodiment of the present invention. With a semiconductor chip that has adhesive resin 61 at back oxide film 62 and side wall oxide film 66 on one side of device silicon layer 63, tungsten pad 68 on surface oxide film 66 can be electrically connected to antenna 69 via electroconductive particles 67 by using an anisotropic electroconductive adhesive over which electroconductive particles 65 have been distributed. A thin semiconductor chip-antenna combination free from short-circuiting can be formed because pads are formed using tungsten or a non-oxidizing metal and because side wall oxide films are adopted. Thus, token-device media for forgery protection can be formed by forming a semiconductor device characterized in that semiconductor chips each having a long side up to 0.5 mm in plane dimension and each having pads made of tungsten are inserted in antenna-equipped form into a paper or film-form medium so as to send information of multiple bits.

Figure 8:
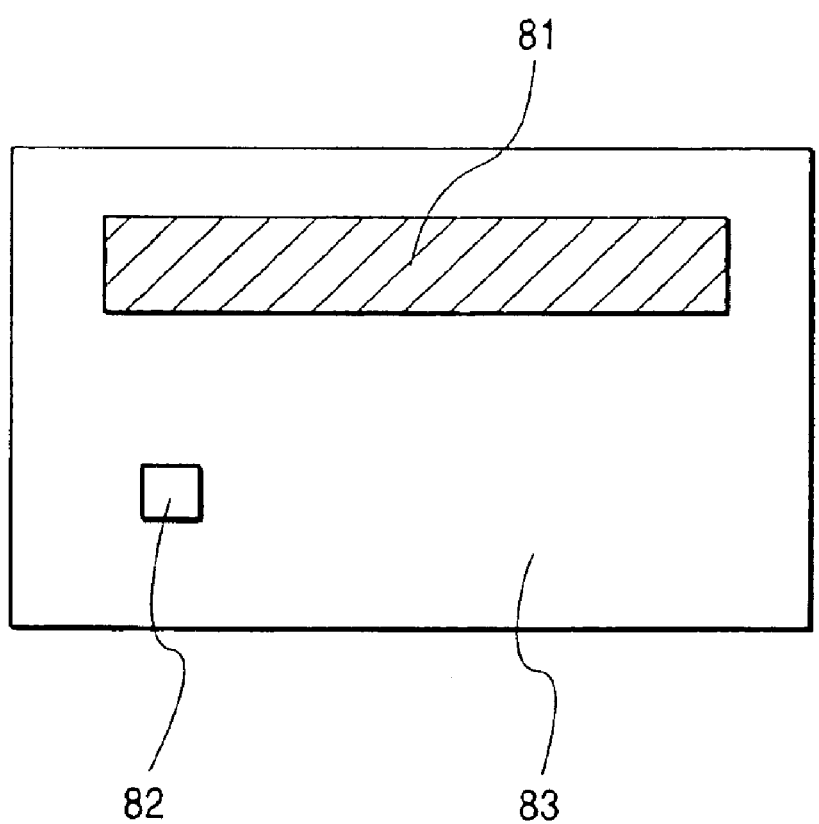
FIG. 8 is a view showing still further embodiment of the present invention.

FIG. 8 shows still another embodiment of the present invention. Medium surface printed pattern 81 is located on the surface of film-form medium 83, in which is present a semiconductor chip 82 including an antenna. Since direct emulation of the information contained in the read-only memory of the semiconductor chip results in the forgery protection capability of the memory being lost, whether the medium is a forgery can be confirmed more strictly by cryptographing the information and printing it in numeric data or pattern form. Also, since the semiconductor chip itself can contain only a read-only memory, semiconductor chips can be formed in a small size. In other words, various token-device media highly resistant to forgery can be created by forming a semiconductor device characterized in that semiconductor chips having a long side up to 0.5 mm in plane dimension are inserted in antenna-equipped form into a paper or film-form medium so as to send information of multiple bits, and in that the information is cryptographed and printed on the medium. Information combined with special ink, a magnetic material, and the like, is further used as cryptographed and printed information.

Figure 9A:
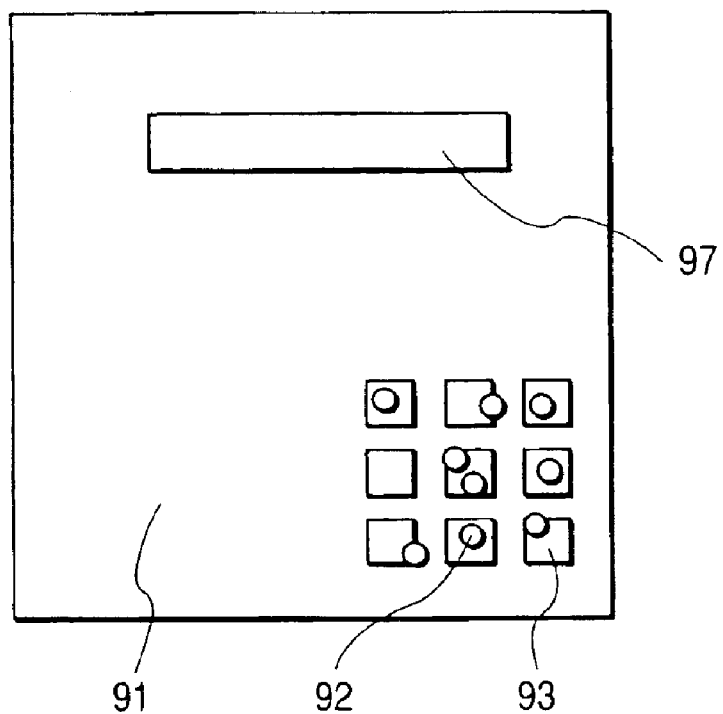
FIG. 9A is a plan view showing an embodiment of the present invention.
Figure 9B:
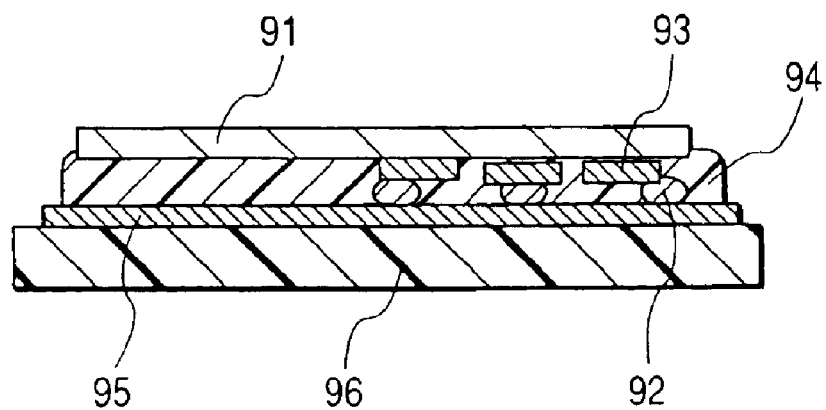
FIG. 9B is a cross-sectional view showing an embodiment of the present invention.

FIGS. 9A and 9B show still another embodiment of the present invention. FIG. 9A is a plan view of semiconductor chip 91. Electroconductive particles 92 exist in distributed form on small pads 93. Also, writable memory area 97 exists in the semiconductor chip 91. FIG. 9B is a cross-sectional view of the semiconductor chip 91 connected to antenna 95 on substrate 96 by use of adhesive resin 94. Since analog data varying with the particular contact resistance against the electroconductive particles between the semiconductor chip and the antenna and with the particular fluctuations in capacity against ferroelectrics can be obtained at the small pads of the semiconductor chip, the analog data is converted into digital data by a random number-generating circuit. The digital data can be used as non-iterative unique information, just like a person's fingerprints, and can therefore contribute to forgery protection of the medium for which the semiconductor chip is to be used. Since the above-mentioned unique information will be lost if the semiconductor chip and the antenna are separated, the information features high tampering resistance, namely, resistance to forgery.

Figure 10:
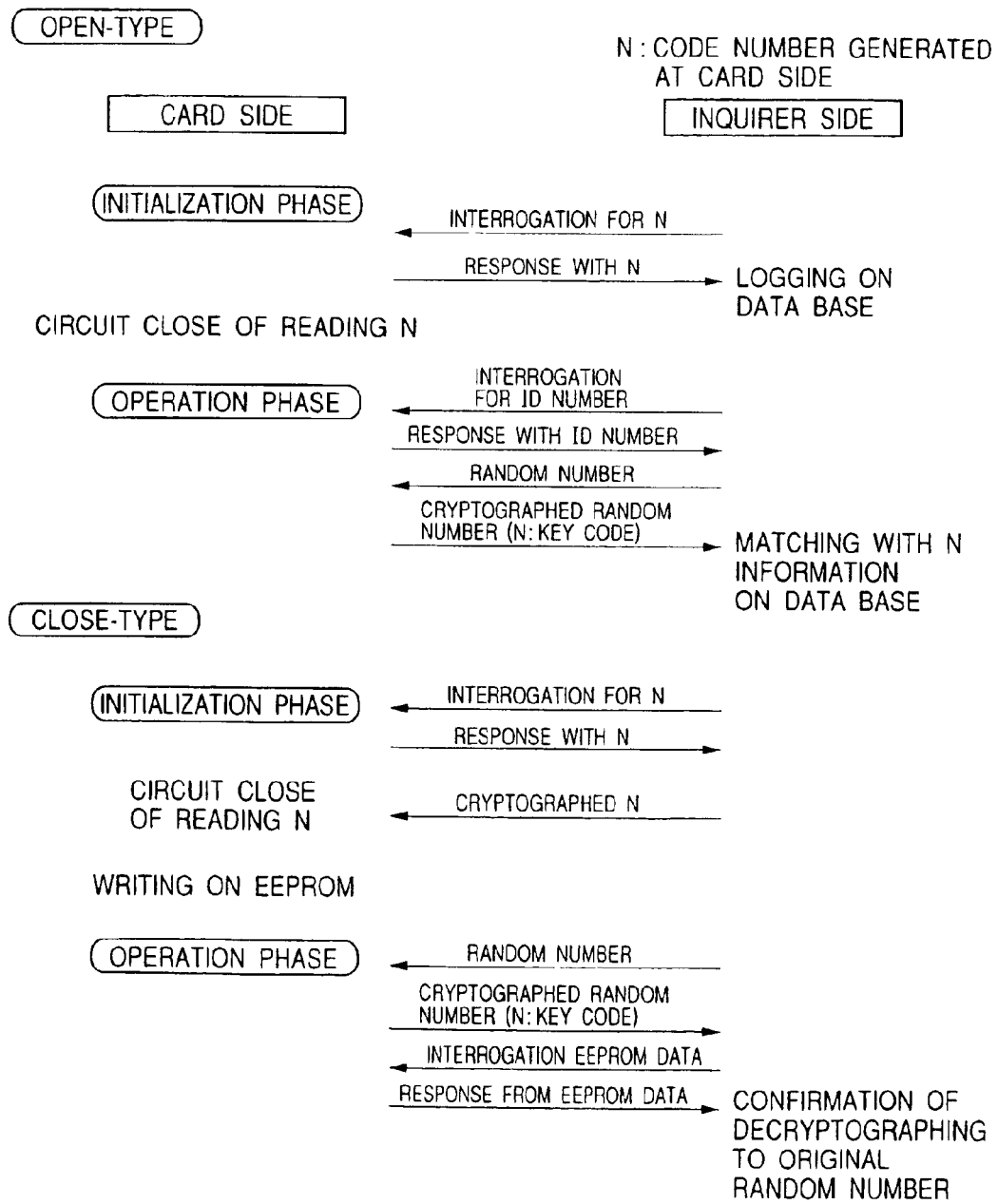
FIG. 10 is a view showing still further embodiment of the present invention.

FIG. 10 shows still another embodiment of the present invention. This figure shows examples of realizing the forgery protection protocols using the semiconductor chips of the present invention and random number-generating circuits contained in these semiconductor chips. Such forgery protection protocols can be broadly divided into an open type and a closed type. First, an example of open-type protocol realization is set forth below. For the open type, during initialization, the code number N to be generated by the semiconductor chip within a film medium (such as a card) is inquired about from an inquirer such as a reader/writer. The card, after responding with N, makes N unreadable by closing the N reading circuit autonomously or in accordance with the appropriate command from the inquirer. After receiving N, the inquirer registers it in a database. During the operation phase, the inquirer first interrogates for the ID of the card. The inquirer, after returning the card ID, places the random number on the card. The card cryptographs the random number with N as the key, and returns the random number to the inquirer. After restoring N from the database and decryptographing N into original form, the inquirer compares restored N and its original value and if both match, the inquirer regards the card as correct. In this embodiment, as far as its application to the forming media in the invention, such as token-device media or marketable securities, is concerned, the card can be changed for any other such type of medium without limitations. Next for the closed type, a writable memory area exists in the semiconductor chip, and during initialization, cryptographed N is written from the inquirer into the memory area of the card. After this, the N reading circuit within the card is closed. Next, a second random number different from the above random number N within the semiconductor chip is given thereto, then the random number N is cryptographed and read out, and the content in the memory area is also read out and returned to the inquirer, where the corresponding memory content is reverted to the second random number. Thus, it is verified that the corresponding semiconductor chip is not a forgery. The use of the cards and system having these features ensures that authenticating the validity of the card is accomplished by checking N.

Figure 11A:
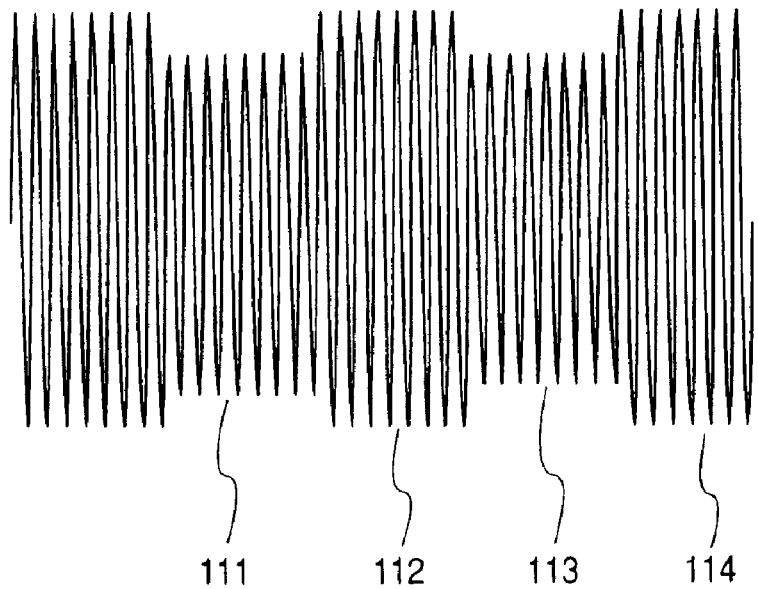
FIG. 11A is a waveform diagram of the electromagnetic wave generated in an embodiment of the present invention.
Figure 11B:
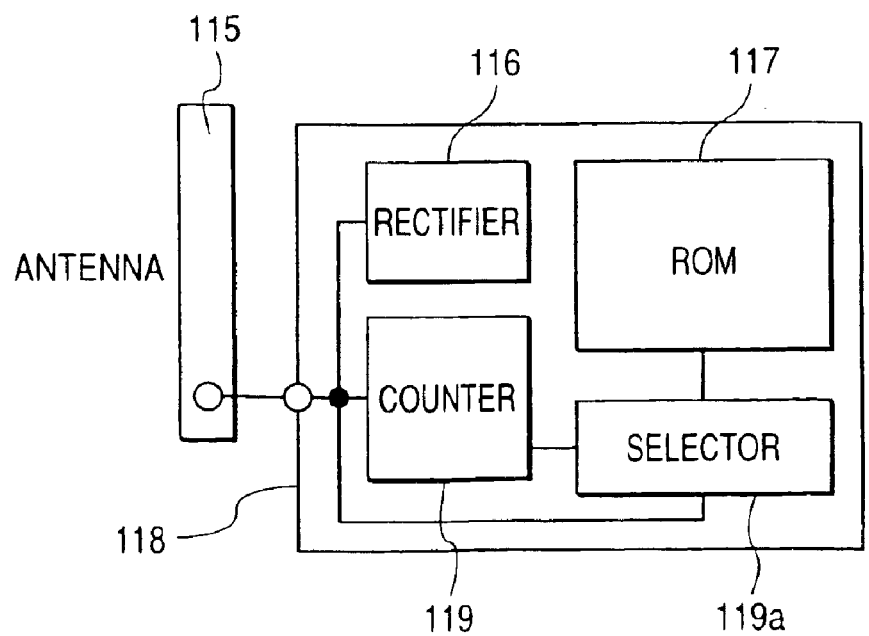
FIG. 11B is a circuit block diagram of an embodiment of the present invention.

FIGS. 11A and 11B show yet another embodiment of the present invention. FIG. 11A is a waveform diagram of the electromagnetic wave that the inquirer in the invention sends to the paper or film-form medium including the semiconductor chip. Although the frequency of carrier waves is arbitrary, the carrier waves themselves are amplitude-modulated and when the nth clock 111 is given, the data of the nth address in the read-only memory will be sent from the semiconductor chip. The second half of the clock cycle is therefore a period during which the nth data 112 is sent. Similarly, periods during which (1+n)th clock 113 or (1+n)th clock 114 follows. This sequence is repeated to read the contents of the read-only memory within the semiconductor chip into the inquirer. That is to say, it is possible to form a semiconductor device characterized in that carrier waves are periodically amplitude-modulated in multi-frequency units and given to each antenna-equipped semiconductor chip, in that the leading edge of each periodic signal is used as a clock, and in that the load of the antenna within the semiconductor chip is varied during the corresponding period and one bit of information is sent from the semiconductor chip. FIG. 11B is a circuit block diagram of semiconductor chip 118. Antenna 115 is connected to rectifier 116 and a voltage is supplied to the semiconductor chip. At the same time, data enters counter 119, from which the data is then sent in units of one bit together with a 119a selector signal, the output of ROM 177. These elements constitute a compact semiconductor chip. That is to say, it is possible to form a semiconductor device characterized in that carrier waves are periodically amplitude-modulated in multi-frequency units and given to each antenna-equipped semiconductor chip, in that the semiconductor chip contains a counter, in that the leading edge of each periodic signal is used as a clock and the signal is sent to the counter, in that the output signal from the counter selects a memory output signal, and in that the load of the antenna within the semiconductor chip is varied during the corresponding period and one bit of information is sent from the semiconductor chip.

Figure 12:
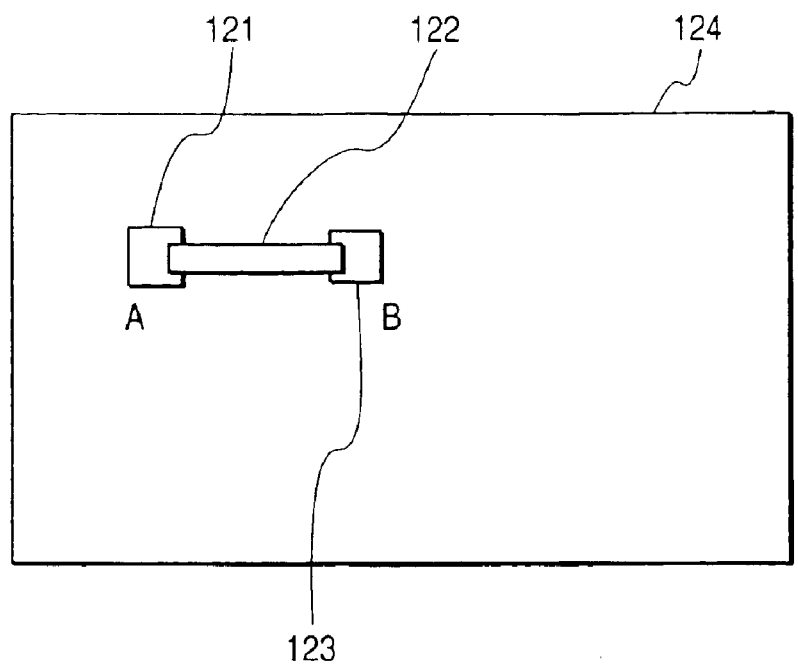
FIG. 12 is a view showing an embodiment of the present invention.

FIG. 12 shows further another embodiment of the present invention. Film-form medium 124 contains a first semiconductor chip 121 and a second semiconductor chip 123, both of which are connected across antenna 122. In general, a semiconductor device is formed that is characterized in that a plurality of semiconductor chips share one antenna and in that each semiconductor chip operates according to the particular operational status of the antenna. Thus, it is possible to mount multiple semiconductor chips easily without forming a complex congestion circuit in a semiconductor chip, to make a semiconductor chip assist a damaged one, and hereby to improve the reliability of the medium.

Furthermore, a system even higher in security can be constructed by assigning unique information to multiple semiconductor chips and creating a program so that the semiconductor chips report the respective relationships to each other and so that when more than one predetermined requirement is satisfied, data will be transmitted.

Figure 13:
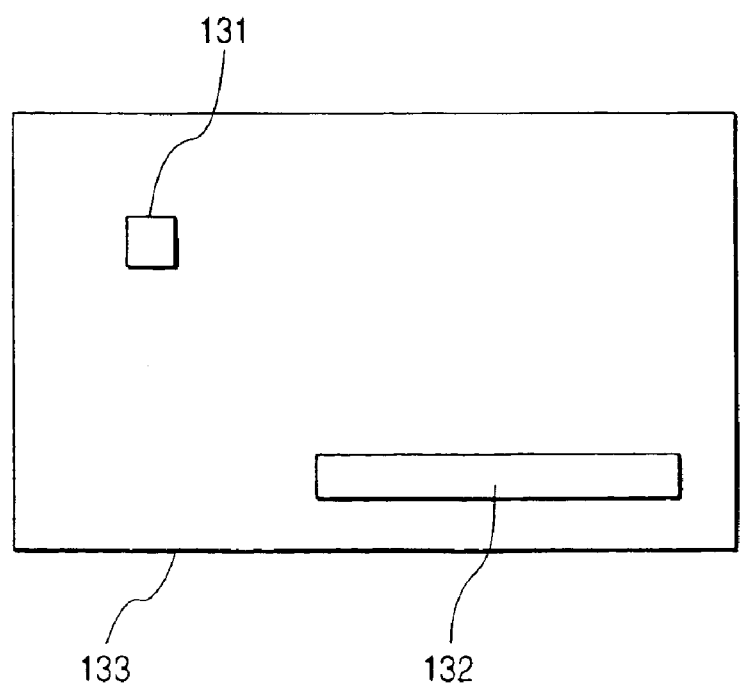
FIG. 13 is a view showing another embodiment of the present invention.

FIG. 13 shows further another embodiment of the present invention. Semiconductor chip 131 is sealed in film-form medium 133 which has cryptographed physical information notation column 132 on the surface. To ensure forgery protection, it is absolutely necessary that physically identical media be difficult to form with accuracy and that advanced identification technology be used. Even if the semiconductor chip itself is to be formed using advanced process technology, it is difficult without the proper manufacturing technology to make a counterfeit semiconductor chip called "clone." Semiconductor process technology is represented by the accuracy level of the micropattern. Even if an identical function is realized, therefore, a higher degree of process technology will reduce semiconductor chips in size. Also, technical levels will improve with time and if the semiconductor chips are the same in function, their physical shapes will decrease, and if the semiconductor chips are the same in physical shape, their functions will improve. Whether the particular semiconductor chip and mounting method are forgeries can be identified more easily by forming a semiconductor device characterized in that all or part of physical information on the size, thickness, position, angle-of-inclination, and other factors of the semiconductor chip to be inserted in antenna-equipped form into a paper or film-form medium so as to send information of multiple bits is cryptographed and printed on the medium.

Figure 14:
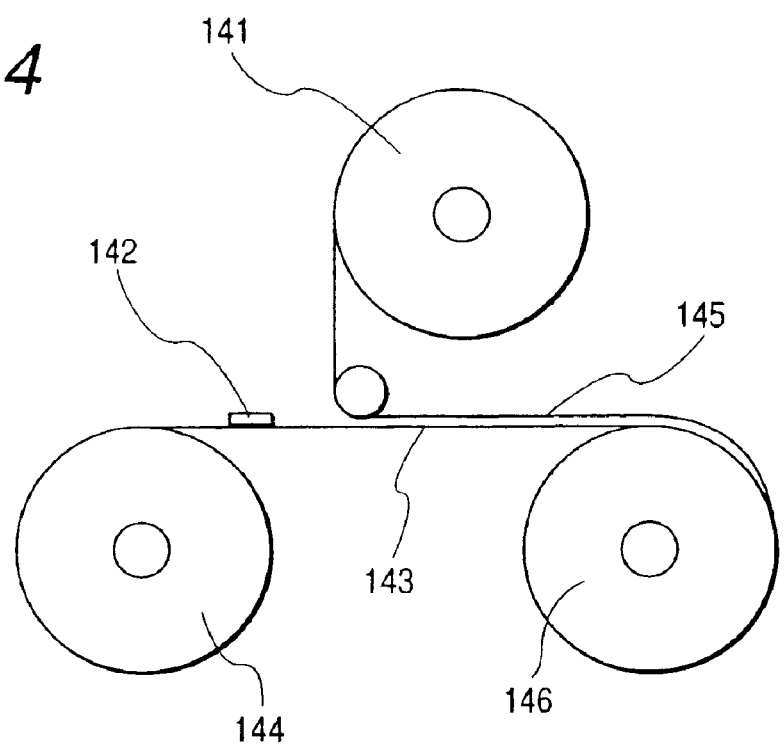
FIG. 14 is a view showing an example of the film roll status in the present invention.

FIG. 14 shows a further another embodiment of the present invention. A first cover film roll 141 and a second cover film roll 144 are present, semiconductor chip 142 is inserted between a first cover film 145 and a second cover film 143, and a medium including a finished semiconductor chip is taken up onto take-up roll 146. The materials to be used for the cover films are not limited to any specific materials such as paper, synthetic paper, plastics, cloth, or fiber cloth. The semiconductor chip is automatically picked up and positioned. This semiconductor chip may have a mounted antenna beforehand or may be printed on the first or second film or may be bonded thereto using an electro-conductive adhesive when the chip is inserted into the film via a wire. The surface of the intermediate bonding film into which the semiconductor chip has been inserted is coated with another adhesive, namely, an urethane-based, cyano-based, or UV-setting adhesive, with the result that the film is formed so as to ensure low temperature and the flatness and rigidity of the finished medium.

Figure 15A:
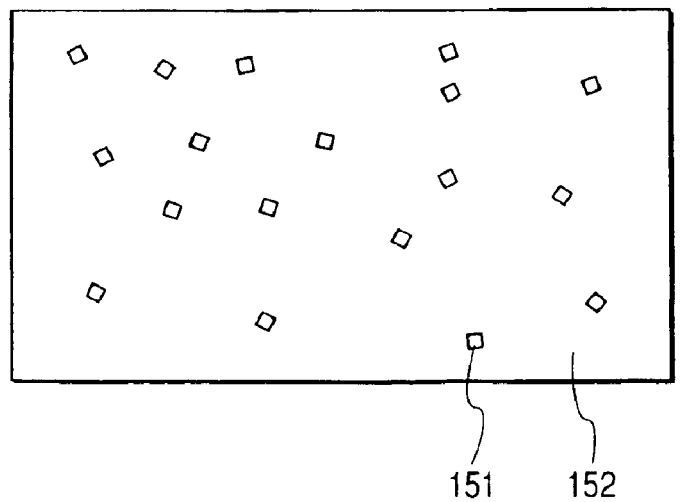
FIG. 15A is a view showing the distributed status of semiconductor chips within a is film-form medium.
Figure 15B:
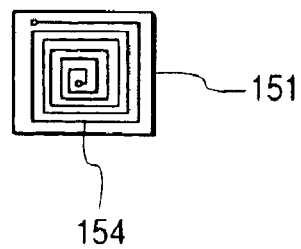
FIG. 15B is a view showing a status in which a semiconductor chip has an mounted antenna.

FIGS. 15A and 15B show a further another embodiment of the present invention. FIG. 15A shows one of the states where a plurality of semiconductor chips 151 are arranged in distributed form inside film-form medium 152. FIG. 15B shows an example in which small antenna 154 is mounted on each of the semiconductor chips 151 in FIG. 15A. The shape and characteristics of the antenna differ according to the radio frequency to be used or the particular amount of energy. One possible method of forming the antenna is by shaping micro-wiring into coil form by use of semiconductor wiring process technology. The use of multilayer wiring or copper wiring technology enables a compact and low-resistance coil long in wiring run. On-semiconductor formation of the antenna increases the reliability of its connection while at the same time reducing manufacturing processes and enabling economical formation of the semiconductor chip. Distributed arrangement of multiple semiconductor chips in a medium enables non-repeatability to be achieved, and this arrangement can be a compensation means for semiconductor failures and ensures forgery protection and higher reliability. Various token-device media for forgery protection can be realized more easily by forming a semiconductor device characterized in that an antenna smaller than a semiconductor chip is mounted thereon and in that multiple such semiconductor chips are inserted into a paper or film-form medium so as to send information of multiple bits without radio interference.

Figure 16:
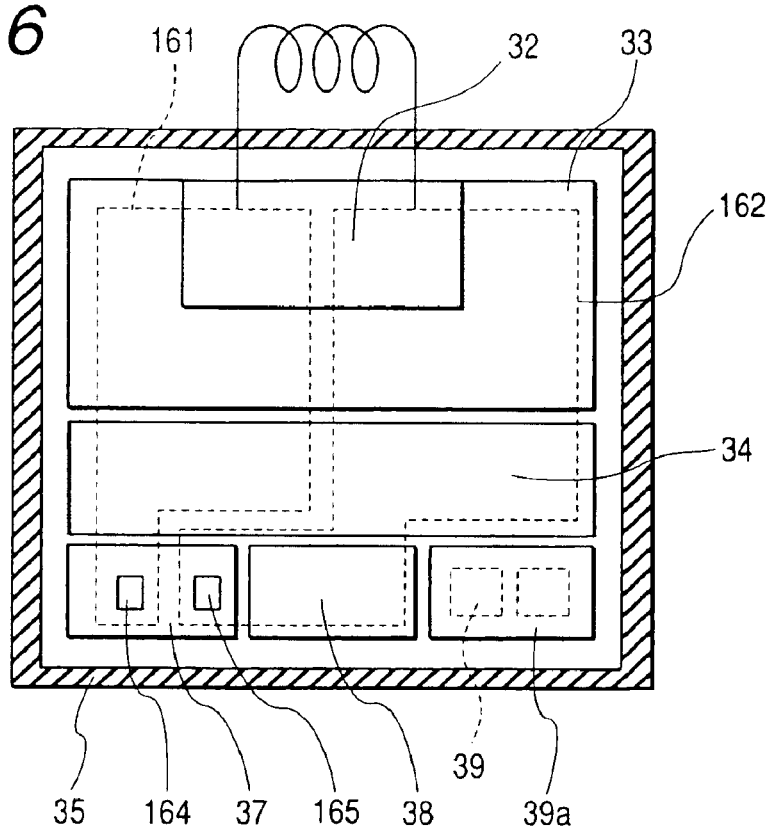
FIG. 16 is a view showing an embodiment of the present invention.

FIG. 16 shows a further another embodiment of the present invention. A first antenna pad 161 and a second antenna pad 162 exist on the active device of a semiconductor chip and are connected across antenna coil 163. Although this figure assumes a coil-form antenna, the pads can be connected to the antenna terminals of a dipole antenna, instead. The first antenna pad and the second antenna pad are connected to the sending/receiving circuit of the semiconductor chip through a first through-hole 164 and a second through-hole 165, respectively. In this way, multiple pads are provided on an active device and connected to an antenna or an external capacity-provided circuit element, depending on the particular requirements. The pads and the antenna are connected by press-fitting or using an adhesive. The use of an anisotropic electroconductive adhesive enables efficient connection of multiple pads and a substrate wiring pattern just by performing one bonding/heating/pressurizing operation.

Figure 17:
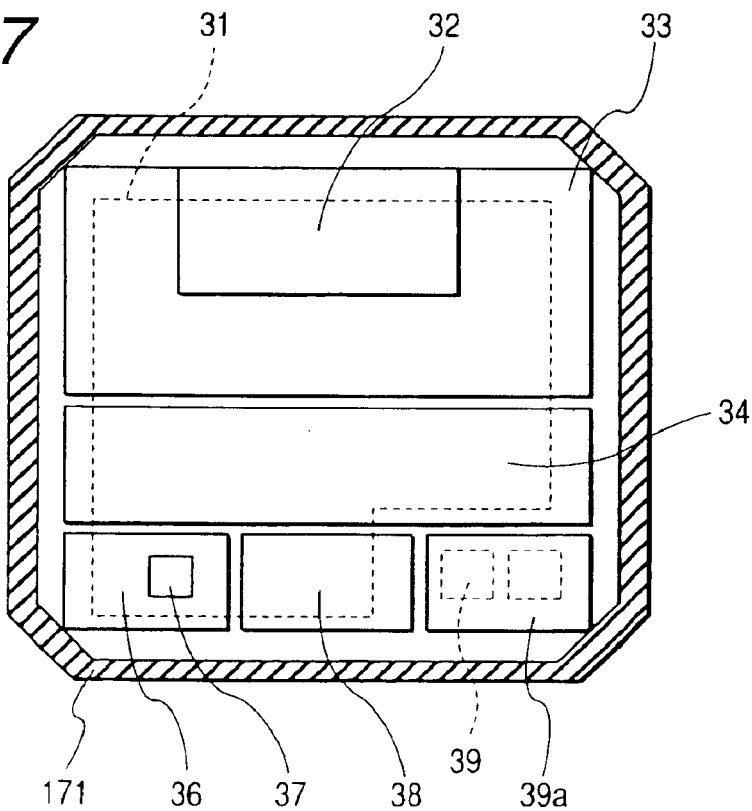
FIG. 17 is a view showing another embodiment of the present invention.

FIG. 17 shows a further another embodiment of the present invention. This figure is a plan view of an embodiment, showing that tapered corner members 171 are provided at the corners of a semiconductor chip. In order to use the area of the semiconductor chip more effectively by increasing mechanical strength against concentrated loads and bending loads and by removing the cutting width of a dicing blade, the separation of the semiconductor chip is conducted using etching technology. At this time, the pattern of the separation groove is designed so that the corner shape of the as-finished semiconductor chip is optimized for reduced mechanical stress concentration by shaping the corners of the semiconductor chip into tapered or round form. Thus, high reliability can be conferred on forgery protection token-device media that uses a semiconductor device characterized in that a semiconductor chip with a plane dimension up to 0.5 mm on its long side is inserted in antenna-equipped form into a paper or film-form medium so as to send information of multiple bits, and in that the corners of the semiconductor chip are taper-cut to $\frac{1}{100}$ of the length of the long side.

Figure 18:
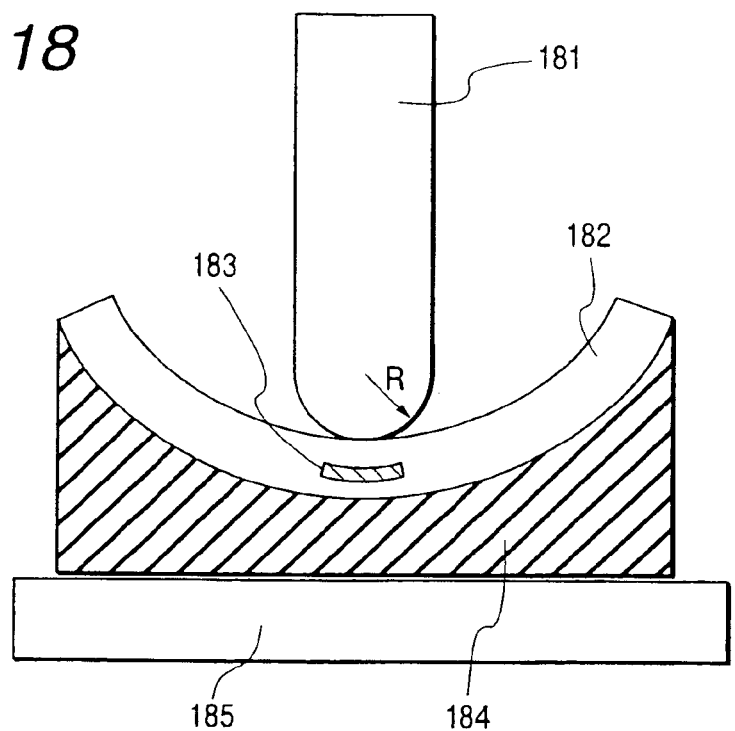
FIG. 18 is a view showing still another embodiment of the present invention.

FIG. 18 shows a further another embodiment of the present invention. Stress concentration tool 181 is pressed against film-form medium 182, and semiconductor chip 183 is located under the stress concentration tool, on or near the neutral plane of the medium. At the bottom of the film-form medium is present a silicon rubber 184, which exists on steel plate 185. The silicon rubber indicates an environment in an actual living space where it is located in the vicinity of the film-form medium. The stress concentration tool is at least 1 mm in diameter, and it indicates an environment in an actual living space where a concentrated load is applied. As shown in FIG. 18, the film-form medium deforms according to the particular magnitude of the concentrated load, resulting in such cross-sectional status as shown in FIG. 18. The empirically obtained relationship between the concentrated-load resistance of the film-form medium under this state and the size of the semiconductor chip is represented in FIG. 19.

Figure 19:
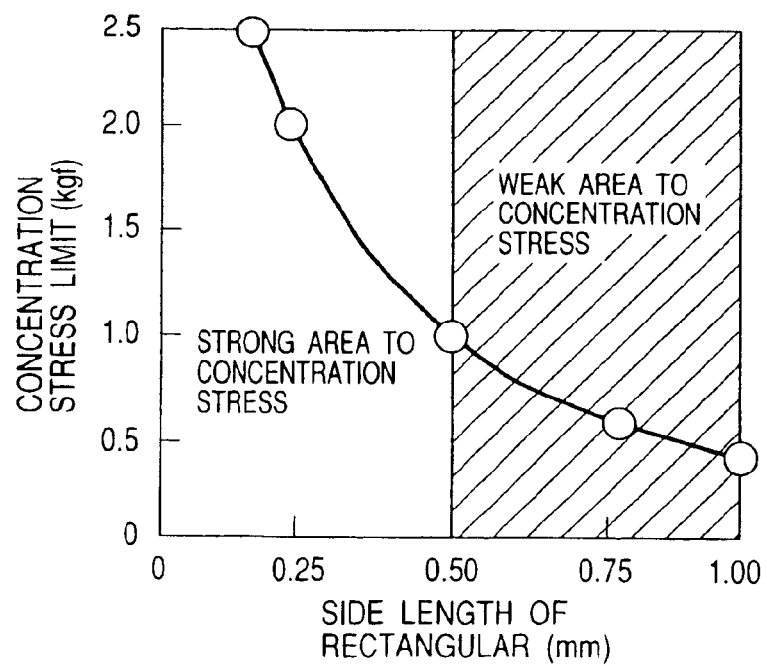
FIG. 19 is a view showing an example of logical justification of the validity of the present invention.

Supposing that the pressures applied to the film-form medium by persons in an actual living space are about 700 g and that whether the medium can withstand a concentrated load of 1 kg is one criterion, the inventors have found from FIG. 19 that the medium can be separated into an area resistant to the concentrated load in the case of a semiconductor chip size up to 0.5 mm, and an area not resistant to the concentrated load in the case of a semiconductor chip size exceeding 0.5 mm. With this fact in mind, the inventors consider it to be a technical minimum requirement to create various forgery protection token-device media forming part of a semiconductor device characterized in that semiconductor chips are formed with a plane dimension up to 0.5 mm on the long side, in that each of these semiconductor chips is inserted in antenna-equipped form into a paper or film-form medium so as to send information of multiple bits, and in that each semiconductor chip is up to 50 microns thick. The inventors also consider that the technology for forming these media forms part of the present invention.

Figure 20A:
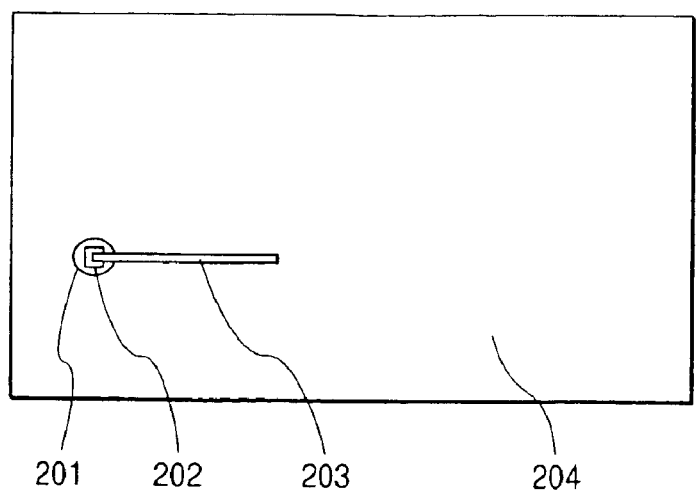
FIG. 20A is a plan view showing an embodiment of the present invention.
Figure 20B:
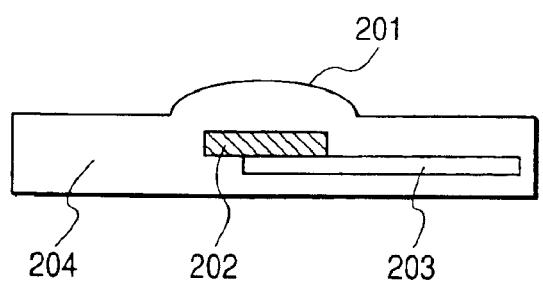
FIG. 20B is a cross-sectional view showing an embodiment of the present invention.

FIGS. 20A and 20B show a further another embodiment of the present invention. Braille-use bump 201 on film-form medium 204 contains semiconductor chip 202 equipped with antenna 203. Token-device media and the like come with braille-use bumps, and semiconductor chips up to 0.5 mm in size can be embedded in these bumps. This arrangement can contribute to the improvement of the structural strength of semiconductor chip mounting portions. More specifically, reliability can be improved by forming various forgery protection token-device media that contain a semiconductor device characterized in that semiconductor chips are formed with a plane dimension up to 0.5 mm on the long side, in that each of these semiconductor chips is inserted in antenna-equipped form into a paper or film-form medium so as to send information of multiple bits, and in that each semiconductor chip is present in a braille-use bump.

Figure 21:
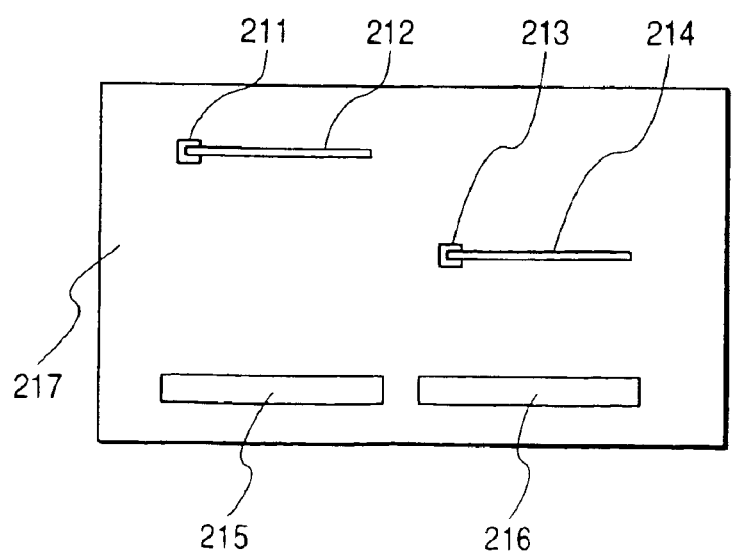
FIG. 21 is a view showing an embodiment of the present invention.

FIG. 21 shows a further another embodiment of the present invention. A first semiconductor chip 211 connected to a first antenna 212, and a second semiconductor chip 213 connected to a second antenna 214 are present in film-form medium 217. At this time, a first cryptographed physical information notation column 215 and a second cryptographed physical information notation column 216 exist on the surface of the film-form medium. Output information from the first semiconductor chip is printed in numeric data or special pattern form on the first cryptographed physical information notation column, and output information from the second semiconductor chip is printed in numeric data or special pattern form on the second cryptographed physical information notation column. Thus, forgery identification is possible, even if either semiconductor chip is damaged. In general, a highly reliable method can be supplied by forming various forgery protection token-device media that uses a semiconductor device characterized in that a plurality of semiconductor chips have a plane dimension up to 0.5 mm on the long side, in that each of these semiconductor chips is inserted in antenna-equipped form into a paper or film-form medium so as to send information of multiple bits, and in that the information contained in each semiconductor chip is printed in cryptographed pattern form on the medium.

Figure 22:
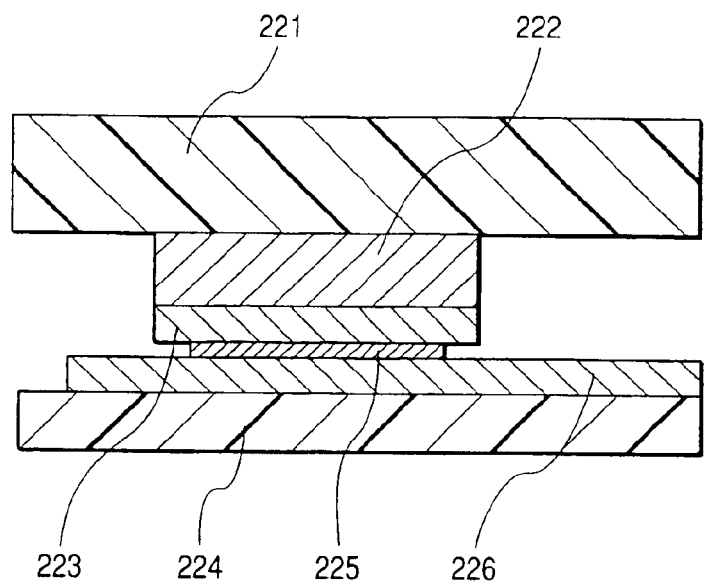
FIG. 22 is a cross-sectional view showing an embodiment of the present invention.

FIG. 22 shows a further another embodiment of the present invention. Semiconductor chip 223 of the structure where antenna 226 is connected to antenna pad 225 is present between a first cover film 221 and a second cover film 224, and the semiconductor chip is reinforced by reinforcement metal 222. The reinforcement metal can provide improvements against a concentrated load by being made of a material large in elastic modulus. Although it is desirable that the reinforcement metal be thicker, it has its own limits since the thickness of the film-form medium which can be used is limited. A thickness greater than that of the semiconductor chip, therefore, is the appropriate thickness of the reinforcement metal, and hereby, improvement effects can be obtained. It is desirable that the reinforcement metal and the semiconductor chip be bonded as strongly as possible, and this is required for the purpose of reducing the tensile stresses on the thin semiconductor chip. According to the present invention, a method excellent in reliability can be supplied by forming various forgery protection token-device media that uses a semiconductor device characterized in that a semiconductor chip with a plane dimension up to 0.5 mm on its long side is inserted in antenna-equipped form into a paper or film-form medium so as to send information of multiple bits, and in that a metal thicker than the semiconductor chip is bonded thereto.

Figure 23:
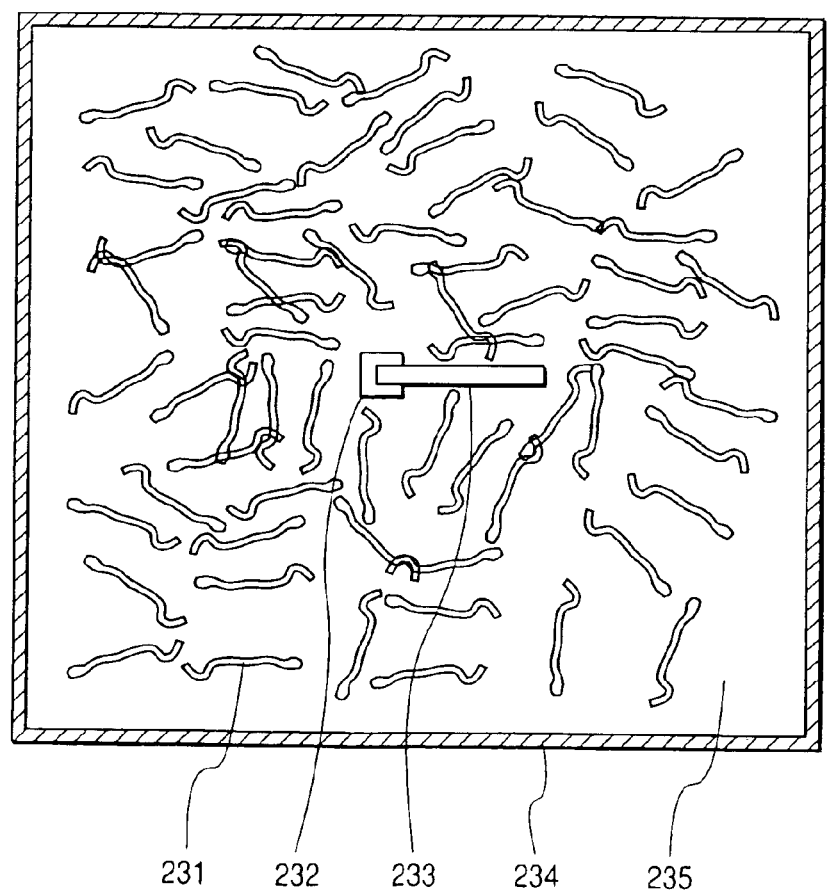
FIG. 23 is a plan view showing an embodiment of the present invention.

FIG. 23 shows a further another embodiment of the present invention. A multitude of Japanese-paper fibers 231 formed into shape by water-processing frame 234 are present on water-processing net 235. Semiconductor chip 232 with antenna 233 is processed in water together with the Japanese-paper fibers. A semiconductor chip up to 0.5 mm in size can be handled as part of the fiber section, and inserted into the paper. Although one semiconductor chip is typically shown in this figure, a mixture of multiple semiconductor chips also falls within the scope of the present invention. More specifically, a simplified realizable processing means can be supplied by forming various forgery protection token-device media that uses a semiconductor device characterized in that a semiconductor chip with a long side up to 0.5 mm in plane dimension is inserted in antenna-equipped form into a Japanese-paper medium so as to send information of multiple bits, and in that when Japanese paper is processed in water, the semiconductor chip is handled as part of the paper fiber section and mounted in or on the paper.

Figure 24:
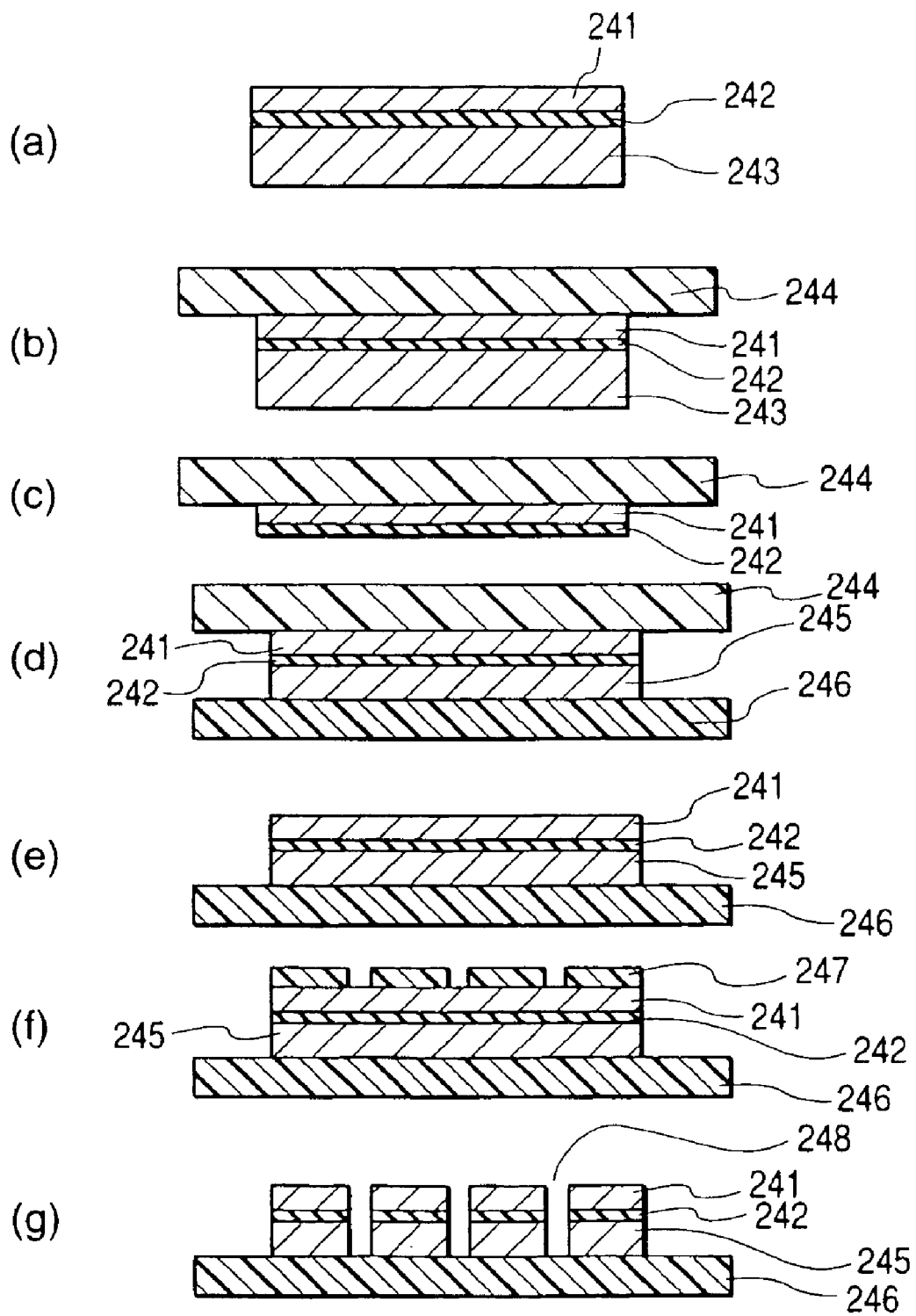
FIG. 24 is a view showing an embodiment of the present invention.

Views (a) to (g) in FIG. 24 show still another embodiment of the present invention. View (a) in FIG. 24 is an as-formed cross-sectional view of a silicon-on-insulator wafer type device having an oxide film layer 242 between device layer silicon 241 and substrate silicon wafer 243. View (b) in FIG. 24 is a cross-sectional view of the wafer existing immediately after a first support sheet 244 has been attached to the principal plane side of the wafer following completion of its formation. View (c) in FIG. 24 is a cross-sectional view of the wafer existing immediately after the substrate silicon has been removed using a silicon-only etching chemical (such as potassium hydroxide) following completion of the sheet-attaching process mentioned above. The oxide film layer 242 functions as an etching stopper for the chemical, and is valid for obtaining very thin semiconductor chips that range from, for example, 0.1 to 50 microns in thickness. View (d) in FIG. 24 is a cross-sectional view of the wafer existing immediately after, following completion of silicon removal, it has been connected to reinforcement metal 245 provided with a second support sheet 246. View (e) in FIG. 24 is a cross-sectional view of the wafer existing immediately after the support sheet has been removed following completion of connection to the reinforcement metal. View (f) in FIG. 24 is a cross-sectional view of the wafer existing immediately after, following completion of the removal of the first support sheet, the wafer has been coated with photoresist 247, then exposed to light, and has undergone photographic processing. The mask pattern is a linear pattern separating the semiconductor chip. View (g) in FIG. 24 is a cross-sectional view of the wafer existing immediately after, following completion of the above-mentioned process, separation grooves have been formed by etching the reinforcement metal, the oxide film, and the device layer silicon. A thin and compact semiconductor chip with a reinforcement metal can be formed efficiently, stably, and with high reliability, by performing these processes.

Figure 25:
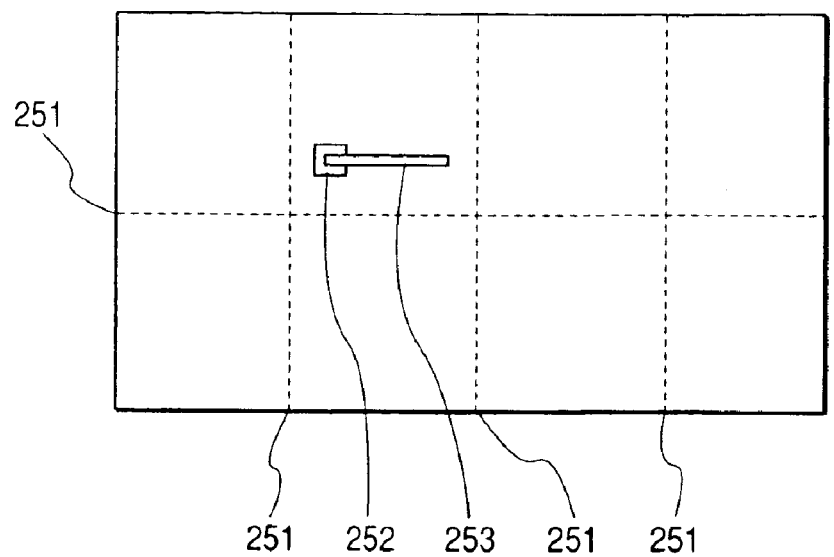
FIG. 25 is a plan view showing an embodiment of the present invention.

FIG. 25 is a plan view showing still another embodiment of the present invention. Integer-multiple fold lines 251 exist along the long and short sides of the film-form medium shown in this plan view. Highly reliable structure free of semiconductor chips at integer-multiple folding positions and reduced in the probability of damage due to folding can be supplied by forming various forgery protection token-device media that uses a semiconductor device characterized in that when semiconductor chips 252 each having an antenna 253 are placed in a medium, these semiconductor chips have a long side up to 0.5 mm in plane dimension, in that the semiconductor chips are inserted in antenna-equipped form into a paper or film-form medium so as to send information of multiple bits, and in that no such semiconductor chips are arranged at integer-multiple folding positions on the medium.

Figure 26A:
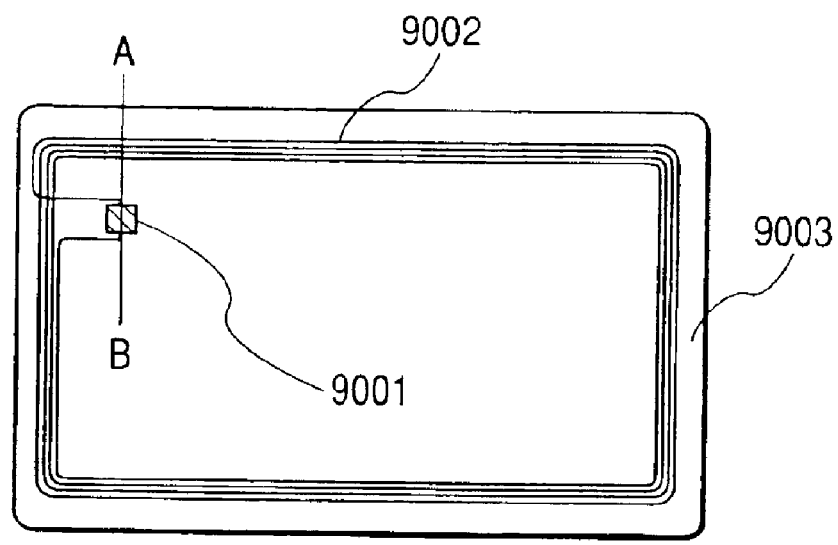
FIG. 26A is a plan view showing another embodiment of the present invention.
Figure 26B:
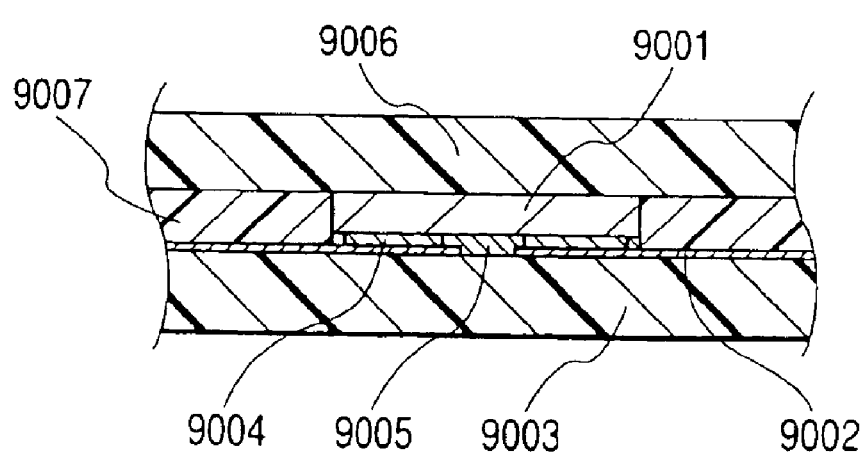
FIG. 26B is a cross-sectional view showing the embodiment of FIG. 26A.

Still another embodiment of the present invention is described using FIGS. 26A and 26B. In this embodiment, the invention is applied to a proximity-type non-contact IC card complying with ISO/IEC 14443. FIG. 26A is a view showing the status that one IC semiconductor chip 9001 containing a memory and a communications control function is mounted on card-form wiring substrate 9003 having an formed antenna coil 9002 is seen from the side at which the device of the IC semiconductor chip is not formed. FIG. 26B is a cross-sectional view of the semiconductor chip portion of a finished card, shown as an A-B line in FIG. 26A.

In this embodiment, the wiring substrate 9003 on which the antenna coil 9002 is formed has the IC semiconductor chip 9001 mounted so that electrode bump 9004 faces downward against the coil. The wiring substrate 9003 is made of polyethylene phthalate (PET) and has the coil 9002 formed by screen printing with electroconductive paste. The electrode bump 9004 and the coil 9002 are connected using anisotropic electroconductive adhesive 9005. This anisotropic electroconductive adhesive has electroconductive particles distributed inside the adhesive layer, and although the mating portion between the electrode bump 9004 and the coil 9002 is electrically connected via the electroconductive particles located between both, since these electroconductive particles are distributed, other electrode bump-coil sections not facing each other suffer no electrical short-circuiting. In this embodiment, the size and thickness of the IC semiconductor chip 9001 are 0.3 mm and about 30 microns, respectively, and the back face of the silicon wafer with a formed device has been ground to a smaller thickness by combined use of mechanical grinding and chemical grinding and then diced to obtain the thin IC semiconductor chip. Card surface layer 9006 made of PET is provided at the side where the device of the IC semiconductor chip 9001 is not formed, and the IC semiconductor chip 9001 and resin layer 9007 are embedded in double-layer PET to form the card of laminated structure.

In this embodiment, an inexpensive non-contact IC card resistant to bending and to point pressure and capable of being reduced in thickness can be obtained because the semiconductor chip is small in both area and thickness and because it is connected to a printed coil via an anisotropic electroconductive adhesive.

Figure 27A:
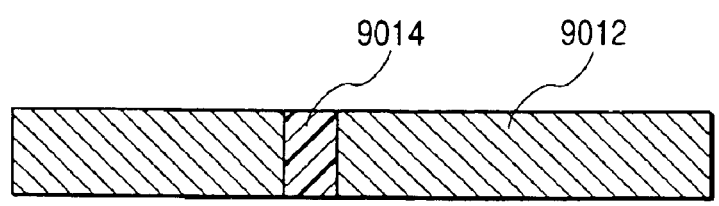
FIG. 27A is a plan view showing an embodiment of the present invention.
Figure 27B:
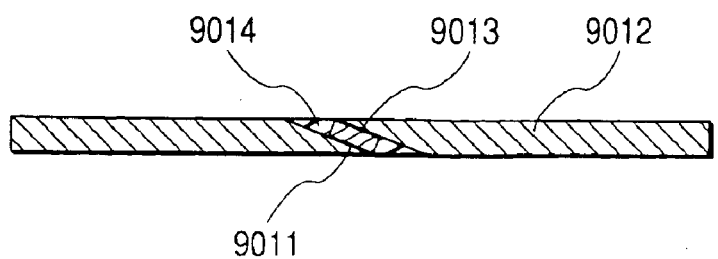
FIG. 27B is a partial cross-sectional view of a semiconductor chip.

FIGS. 27A and 27B show further another embodiment of a semiconductor device based on the present invention. FIG.

27A is a plan view of a semiconductor chip portion, and FIG. 27B is a cross-sectional view thereof. In this embodiment, one gold bump 9013 that has been formed by vapor deposition is provided on both the surface and back of the device of IC semiconductor chip 9011, and bump 9013 is connected to zinc-plated copper rectangular antenna 9012. The IC semiconductor chip 9011 is connected so as to ensure that its principal plane is inclined with respect to that of the antenna 9012 and that the end of the IC semiconductor chip does not protrude from either side of the antenna. The periphery of the IC semiconductor chip 9011 is filled with resin 9014 and the IC semiconductor chip is embedded between one pair of antennas, with the result that the entire semiconductor device is structurally flat and rectangular.

The IC semiconductor chip 9011 used in this embodiment is 0.25 mm in size and about 50 microns thick, including the gold bump, and the antenna 9012 is 0.15 mm thick. The principal plane of the IC semiconductor chip 9011 is inclined by about 30 degrees with respect to that of the antenna 9012 in order for the IC semiconductor chip not to protrude from the surface of the antenna, with the width of the antenna being greater than that of the IC semiconductor chip.

In this embodiment, since the entire IC semiconductor chip is embedded in the thickness of the dipole antenna, a very flat semiconductor device can be obtained, and since the size of the IC semiconductor chip is small, the thickness of the entire semiconductor device can be reduced, even if it is inclined in structure. Although the semiconductor device in this embodiment can be used alone, the rectangular semiconductor device shown in FIG. 27 can be embedded in another substrate to take the shape of, for example, an ordinary credit card.

FIGS. 28A to 28E show yet another embodiment of a semiconductor device based on the present invention, and a method of manufacturing this semiconductor device. In this embodiment, as shown in the plan view of FIG. 28A and the cross-sectional view of FIG. 28B, two bumps 9023 are formed on the side at which the device of IC semiconductor chip 9021 is formed, and both bumps are connected to antenna 9022 via anisotropic electroconductive adhesive 9024. The width of the rectangular antenna 9022 made of copper is smaller than that of the IC semiconductor chip 9021.

Figure 28A:
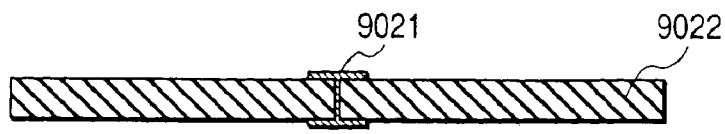
FIG. 28A is a plan view showing an embodiment of the present invention.
Figure 28B:
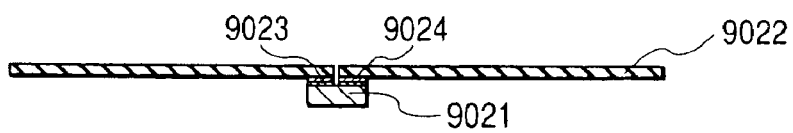
FIG. 28B is a cross-sectional view showing the embodiment of FIG. 28A.
Figure 28C:
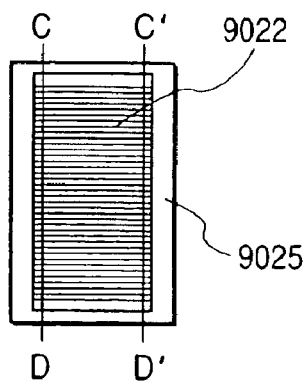
FIG. 28C is a plan view showing the frame of an antenna.
Figure 28D:
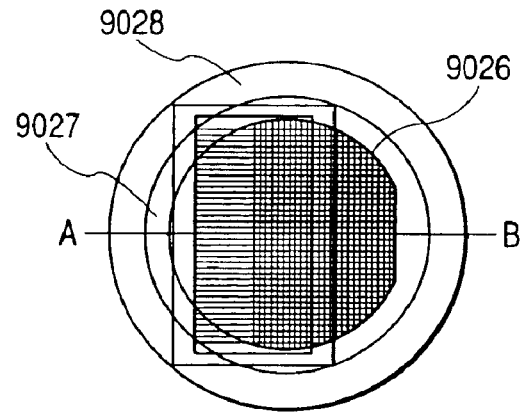
FIG. 28D is a top view of the overlapped status of antenna members and LSI wafer.
Figure 28E:
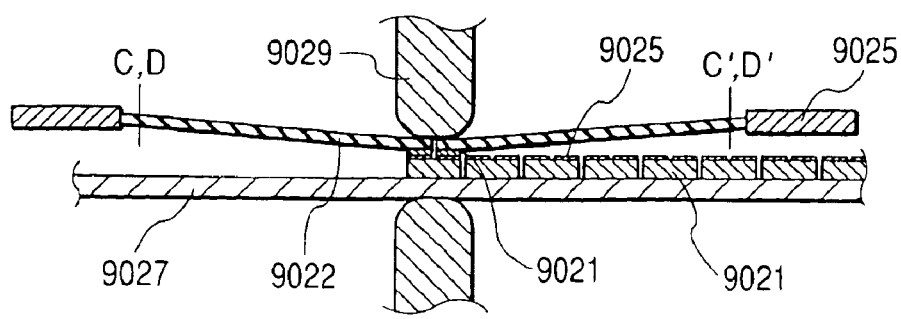
FIG. 28E is a cross-sectional view showing a status in which an antenna and semiconductor chips are connected.

During the manufacture of the semiconductor device pertaining to this embodiment, the antenna members have been processed into the lead frame structure having a multitude of antenna 9022 connected in arranged form to antenna frame 9025 as shown in FIG. 28C. The pitch between the adjacent antennas in the lead frame structure mentioned above is equal to the pitch of the IC semiconductor chip 9021 shown in FIGS. 28A and 28B, and the interval between the antennas facing each other is equal to that of the antenna pair existing when it is to be connected to the IC semiconductor chip. FIG. 28D shows a status under which the antenna members of the lead frame structure mentioned above and LSI wafer 9026 are overlapped for connecting the antennas 9022 and the IC semiconductor chip 9021. The LSI wafer 9026, after being bonded onto a support sheet attached to the required sheet frame 9028, are diced into separate IC semiconductor chips. Under this state, the antenna members are positioned on the required array of sheet-supported IC semiconductor chips so that the ends of the antennas are arranged on the bumps of the IC semiconductor chips. FIG. 28E shows the cross-sectional structure of the semiconductor wafer at the A-B line in FIG. 28D which shows the connection of the antennas 9022 and the IC semiconductor chips 9021. The ends of the antennas 9022 supported by antenna frame 9025 are fit to only the IC semiconductor chip at the left end of the figure among all IC semiconductor chips 9021 bonded onto the support sheet 9027, and the antennas 9022 and the bumps 9023 on the IC semiconductor chips are connected via anisotropic electroconductive adhesive 9024 by use of heating/pressurizing apparatus 9029. After the required time of heating/pressurization, the IC semiconductor chips 9021 and the support sheet 9027 are detached by heat, then the IC semiconductor chips are separated from the support sheet, and each chip is connected to the antenna. The heating/pressurizing apparatus 9029 mentioned above has the structure where it is long in a vertical direction as shown in FIG. 28E. In the connection processes set forth above, all valid semiconductor chips arranged in line on the support sheet are connected to the antennas 9022 at the same time, after which the antennas are separated from the antenna frame 9025 by being cut at the C-D and C'-D' sections in FIG. 28E, with the result that IC semiconductor chips with a connected dipole antenna are finished. The semiconductor chip located to the left of the semiconductor chips connected in FIG. 28E is already connected to the antenna and separated, and after this process has been performed, the second IC semiconductor chip from the left of the figure, and the multiple IC semiconductor chips in line are connected to the respective antennas.

As set forth above, in this embodiment, since the width of the antenna 9022 is smaller than that of the IC semiconductor chip 9021, the multiple IC semiconductor chips in line on the silicon wafer can be connected to the respective antennas at the same time, which provides the advantages that significant throughput in the manufacturing processes can be obtained and that costs can be reduced. The structure shown in FIGS. 28A and 28B can also be embedded in resin and other substrate materials and used.

Figure 29A:
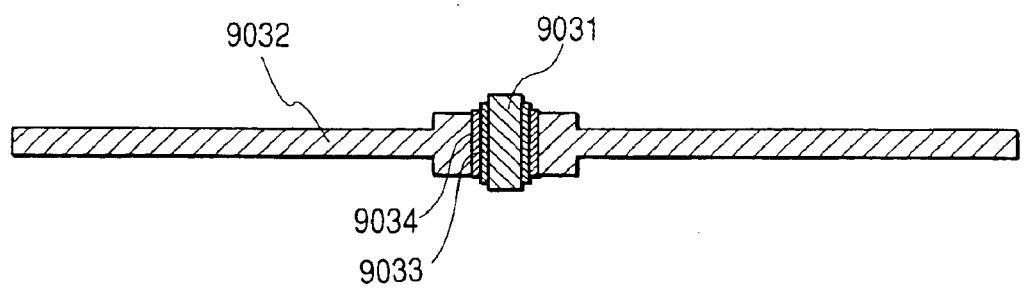
FIG. 29A is a cross-sectional view explaining an embodiment of the present invention.

FIGS. 29A to 29D show yet another embodiment of a semiconductor device based on the present invention, and a method of manufacturing this semiconductor device. In this embodiment, as shown in FIG. 29A, bumps 9033 are formed on both the side at which the device of IC semiconductor chip 9031 is formed, and the side where the device of the IC semiconductor chip 9031 is not formed, and each bump is connected to antenna 9032 via solder 9034. Although the thin line-form antenna 9032 made of copper-sheathed iron is thick at the connection with the IC semiconductor chip 9031, the cross-sectional area of the thick portion is smaller than the area of the IC semiconductor chip 9031.

Figure 29B:
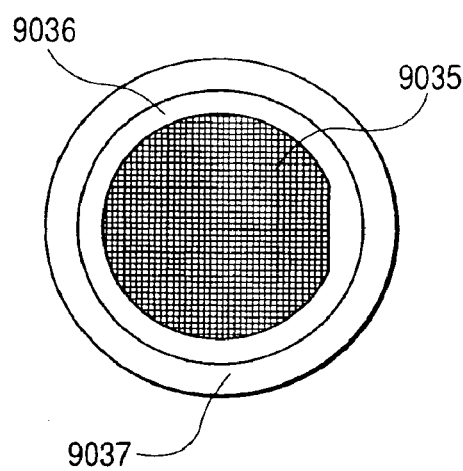
FIG. 29B is a plan view showing an LSI wafer.
Figure 29C:
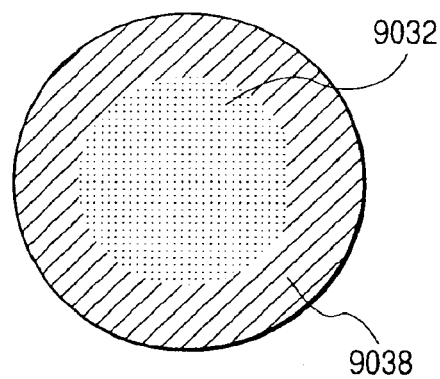
FIG. 29C is a plan view showing the arrangement of antennas.
Figure 29D:
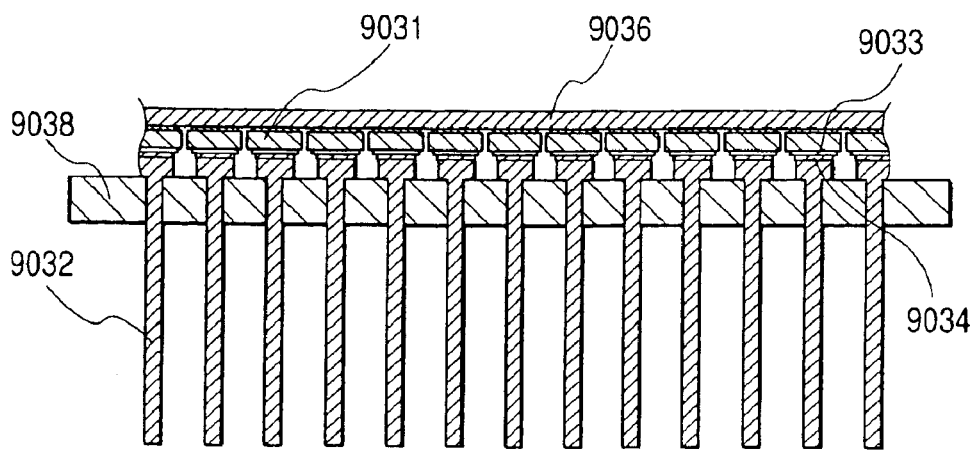
FIG. 29D is a cross-sectional view showing an opposed arrangement of LSI wafers and antennas.

During the manufacture of the semiconductor device pertaining to this embodiment, antenna members are inserted into the hole of antenna support 9038 with a multitude of antennas 9032 arranged in two-dimensional form. The arrangement of these antennas is equal to the array of the IC semiconductor chips 9031 formed on the silicon wafer. FIG. 29B shows the LSI wafer 9035 on which the IC semiconductor chips 9031 are formed, and the LSI wafer 9035, after being bonded onto support sheet 9036 attached to the required sheet frame 9037, are diced into separate IC semiconductor chips. A cross-sectional view of the opposed arrangement of the LSI wafer in FIG. 29B and the antenna unit in FIG. 29C is shown as FIG. 29D. The antenna 9032, although embedded through the hole in the antenna support 9038, does not fall from the support since the thick portion of the antenna that is connected to the IC semiconductor chip is greater than the hole in diameter. Under this state, the antenna members are positioned so that the IC semiconductor chips 9031 bonded onto the support sheet 9036 and the antenna members face each other. Next, the bump 9033 on each IC semiconductor chip and each antenna 9032 are connected via the solder 9034 by heating/pressuring apparatus not shown in the figure. After the required time of heating/pressurization, the IC semiconductor chips 9031 and the support sheet 9036 are detached by heat, then the IC semiconductor chips are separated from the support sheet, and each chip is connected to the antennas. In the connection processes set forth above, one side of each valid semiconductor chip on the support sheet is connected to the antennas at the same time. After this, the two-dimensionally arranged antennas are likewise connected to the other side of each IC semiconductor chip. In this process, since the positions of the antennas need to be matched facing in the opposite direction to that shown in FIG. 29D, a magnet parallel to the support is used for preventing the antennas from falling.

As set forth above, in this embodiment, since the cross-sectional area of each antenna 9032 is smaller than the area of each IC semiconductor chip 9031, the multiple IC semiconductor chips formed in plane form on the silicon wafer can be connected to the respective antennas at the same time, which provides the advantages that significant throughput in the manufacturing processes can be obtained and that costs can be reduced. The structure shown in FIG. 29A can also be embedded in resin and other substrate materials and used.

When preventive measures are to be taken against forgery of various token-device media, the inventors consider that in terms of technology, an added value exists in whether the forgery method is easy. Although the sealing of metallic patterns in token-device media is described in embodiments of prior art, this method not only facilitates the pattern creation itself, but also has a risk close to recommending a method of forgery. Although forgery protection technology is for improving safety as its intended purpose, this technology enhances the reliability of forgery at the same time, and for this reason, forgery protection technology has the danger of no safeguards being provided against a high degree of forgery. It is to be deeply considered, therefore, that undeliberate forgery protection technology turns out to act as a forgery augmenter. In this case, referring to the technical level of metallic pattern creation, the present inventors consider it obvious that since the technology relates to the detection of metals, it is possible to analyze patternized information, even without using advanced technology, just by unsealing the medium and closely examining its contents. In other words, since the detection of metallic patterns is the requirement, its implementing method can be easily selected at a normal technical level. According to the present invention, the practical structure that uses semiconductor chips alone and in conjunction with cryptography and has a random number-generating technique can be economically implemented to protect various token-device media from forgery.

The effectiveness of the above-described solutions to conventional problems can be discovered by presenting means.

The present inventors consider that the mechanical strength of paper and the strength of semiconductor chips require even deeper studies. In one of the conventional embodiments described earlier in this SPECIFICATION, when a configuration with a thickness up to 100 microns is considered, whether problems arise depends greatly on whether no mechanical stresses are applied. That is to say, different restrictions must be defined to mount semiconductor chips on thin paper-form media, and although this deserves to be actively and clearly stated after being considered more deeply, the conventional embodiment mentioned above lacks such active understanding of the importance of defining different restrictions. More specifically, the thickness and size of the semiconductor chips must be studied. For example, when examining whether a semiconductor chip 1 mm in size can withstand use at a normal operating level with paper 100 microns thick, one needs to study about whether the semiconductor chip can withstand use, not whether it can be structurally formed. According to the present invention, it is possible to obtain the effects that solve the problems described above.

During the processing of semiconductor chip periphery, since semiconductor chips that have been diced using a diamond blade are used, if external stresses are applied to the semiconductor chips and concentrated on the periphery thereof, the periphery will break or crack and some or all of the semiconductor chip functions will be lost. If these semiconductor chips are sealed in thin media such as paper, since bending or concentrated load stresses are prone to be applied, even a slight chipping (namely, a nick) around the semiconductor chips will result in their damage. Deep considerations from this viewpoint are not incorporated into the conventional structure. According to the present invention, it is possible to obtain the effects that solve these problems.

No consideration is given to the fact that despite gold bumps being present, side effects may be caused by the presence of the anisotropic electroconductive adhesive or electroconductive adhesive around the semiconductor chips. More specifically, no consideration is given to possible increases in the vertical dimensions of the structure due to the presence of the gold bumps, or to the likely occurrence of short circuits around the semiconductors. As a result, there exists the problem that the configuration of the semiconductor chips that includes the gold bumps makes the total structure of the equipment exceptionally thick and prevents bending-resistant structure from being achieved. According to the present invention, it is possible to obtain the effects that solve these problems.

In order to make it easy to understand the drawings accompanying the present Application, the numerals used therein are listed below.

11 . . . Semiconductor chip side wall oxide film, 12 . . . Device layer silicon, 13 . . . Pad, 14 . . . Back oxide film, 15 . . . Semiconductor chip side wall oxide film, 16 . . . Adhesive resin, 17 . . . Antenna, 18 . . . Substrate, 19 . . . Electroconductive particle, 19a . . . Electroconductive particle, 21 . . . Pad, 22 . . . Device layer silicon, 23 . . . Oxide film layer, 24 . . . Silicon substrate, 25 . . . Support tape, 26 . . . Photoresist, 27 . . . Etching groove, 28 . . . Expanded support tape, 29 . . . Gap, 30 . . . Adhesive layer, 31 . . . Pad, 32 . . . Memory mat, 33 . . . Reading circuit, 34 . . . Selector circuit, 35 . . . Semiconductor chip side wall oxide film, 36 . . . Sending/receiving circuit, 37 . . . Through-hole, 38 . . . Power circuit, 39 . . . Small pad for generating random numbers, 39a . . . Random number-generating circuit, 41 . . . Chipping, 42 . . . Crack, 43 . . . Pad, 44 . . . Semiconductor chip, 45 . . . Adhesive resin, 46 . . . Electroconductive particle, 47 . . . Antenna, 48 . . . Electroconductive particle, 49 . . . Substrate, 51 . . . Semiconductor chip, 52 . . . Antenna, 53 . . . Film-form medium, 55 . . . Capacity-forming antenna electrode 1, 56 . . . Capacity-forming antenna electrode 2, 57 . . . Capacity-forming antenna electrode 3, 58 . . . Capacity-forming antenna electrode 4, 61 . . . Adhesive resin, 62 . . . Back oxide film, 63 . . . Device silicon layer, 64 . . . Side wall oxide film, 65 . . . Electroconductive particle, 66 . . . Surface oxide film, 67 . . . Electroconductive particle, 68 . . . Tungsten pad, 69 . . . Antenna, 71 . . .

Adhesive resin, 72 . . . Device silicon layer, 73 . . . Aluminum pad, 74 . . . Surface oxide film, 75 . . . Electroconductive particle, 76 . . . Gold pad, 77 . . . Electroconductive particle, 78 . . . Antenna, 79 . . . Insulating material, 81 . . . Medium surface printed pattern, 82 . . . Semiconductor chip, 83 . . . Film-form medium, 91 . . . Semiconductor chip, 92 . . . Electroconductive particle, 93 . . . Small pad, 94 . . . Adhesive resin, 95 . . . Antenna, 96 . . . Substrate, 97 . . . Writable memory area, 111 . . . nth clock, 112, nth data, 113 . . . (1+n)th clock, 114 . . . (1+n)th data, 115 . . . Antenna, 116 . . . Rectifier, 117 . . . ROM, 118 . . . Semiconductor chip, 119 . . . Counter, 119a . . . Selector, 121 . . . First semiconductor chip, 122 . . . Antenna, 123 . . . Second semiconductor chip, 124 . . . Film-form medium, 131 . . . Semiconductor chip, 132 . . . Cryptographed physical information notation column, 133 . . . Film-form medium, 141 . . . First cover film roll, 142 . . . Semiconductor chip, 143 . . . Second cover film, 144 . . . Second cover film roll, 145 . . . First cover film, 146 . . . Take-up roll, 151 . . . Semiconductor chip, 152 . . . Film-form medium, 154 . . . Antenna, 161 . . . First antenna pad, 162 . . . Second antenna pad, 163 . . . Antenna coil, 164 . . . First through-hole, 165 . . . Second through-hole, 171 . . . Tapered corner, 181 . . . Stress concentration tool, 182 . . . Film-form medium, 183 . . . Semiconductor chip, 184 . . . Silicon rubber, 185 . . . Steel plate, 201 . . . Braille-use bump, 202 . . . Semiconductor chip, 203 . . . Antenna, 204 . . . Film-form medium, 211 . . . First semiconductor chip, 212 . . . First antenna, 213 . . . Second semiconductor chip, 214 . . . Second antenna, 215 . . . First cryptographed physical information notation column, 216 . . . Second cryptographed physical information notation column, 217 . . . Film-form medium, 221 . . . First cover film, 222 . . . Reinforcement metal, 223 . . . Semiconductor chip, 224 . . . Second cover film, 225 . . . Antenna pad, 226 . . . Antenna, 231 . . . Japanese-paper fiber, 232 . . . Semiconductor chip, 233 . . . Antenna, 234 . . . Water-processing frame, 235 . . . Water-processing net, 241 . . . Device layer silicon, 242 . . . Oxide film layer, 243 . . . Substrate silicon wafer, 244 . . . First support sheet, 245 . . . Reinforcement metal, 246 . . . Second support sheet, 247 . . . Photoresist, 248 . . . Etching groove, 251 . . . Integer-multiple fold line, 252 . . . Semiconductor chip, 253 . . . Antenna, 9001 . . . IC semiconductor chip, 9002 . . . Coil, 9003 . . . Wiring substrate, 9004 . . . Electrode bump, 9005 . . . Anisotropic electroconductive adhesive, 9006 . . . Surface layer, 9007 . . . Resin layer, 9011 . . . IC semiconductor chip, 9012 . . . Antenna, 9013 . . . Bump, 9014 . . . Resin, 9021 . . . IC semiconductor chip, 9022 . . . Antenna, 9023 . . . Bump, 9024 . . . Anisotropic electroconductive adhesive, 9025 . . . Antenna frame, 9026 . . . Wafer, 9027 . . . Support sheet, 9028 . . . Sheet frame, 9029 . . . Heating/pressurizing apparatus, 9031 . . . IC semiconductor chip, 9032 . . . Antenna, 9033 . . . Bump, 9034 . . . Solder, 9035 . . . Wafer, 9036 . . . Support sheet, 9037 . . . Sheet frame, 9038 . . . Antenna support body.

INDUSTRIAL APPLICABILITY

The present invention is useful for protecting token-device media, marketable securities, negotiable commercial coupons or tickets, important documents, IC cards, prepaid cards, and other paper or film-form media from forgery. The invention also enables the implementation of a battery-less non-contact identification method which uses semiconductor chips.

What is claimed is:

1. A non-contact identification semiconductor device comprising:

a bendable paper or bendable film-form medium;

a semiconductor chip inserted into said bendable paper or bendable film-form medium, said semiconductor chip including means for receiving an inquiry to the non-contact identification semiconductor device, a memory for storing identification information of multiple bits and means for sending and said identification information of multiple bits;

an antenna coupled to said semiconductor chip to receive said identification information of multiple bits from said semiconductor chip and to transmit said identification information outside of said non-contact identification semiconductor device; and means for reducing stress concentration on said semiconductor chip during bending of said bendable paper or bendable film-form medium, wherein said means for reducing stress concentration comprises forming said semiconductor chip to have a long side length not greater than 0.5 mm in plane dimension.

2. The non-contact identification semiconductor device according to claim 1, wherein the thickness of said bendable paper or bendable film-form device is up to 100 micrometers, and said bendable paper or bendable film-form device can be used in a bent state.

* * * * *